US 8,501,559 B2

(12) United States Patent
Tang et al.

(10) Patent No.: US 8,501,559 B2
(45) Date of Patent: Aug. 6, 2013

(54) SEMICONDUCTOR CELLS, ARRAYS, DEVICES AND SYSTEMS HAVING A BURIED CONDUCTIVE LINE AND METHODS FOR FORMING THE SAME

(75) Inventors: Sanh D. Tang, Boise, ID (US); John K. Zahurak, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/610,513

(22) Filed: Sep. 11, 2012

(65) Prior Publication Data

US 2013/0005100 A1    Jan. 3, 2013

Related U.S. Application Data

(62) Division of application No. 12/715,922, filed on Mar. 2, 2010.

(51) Int. Cl.
*H01L 21/8234* (2006.01)

(52) U.S. Cl.
USPC .... 438/238; 438/242; 438/268; 257/E21.091; 257/E21.169

(58) Field of Classification Search
USPC ............. 438/128, 197, 238, 241, 242, 266, 438/268, 386; 257/E21.091, E21.169, E21.462
See application file for complete search history.

(56) References Cited

U.S. PATENT DOCUMENTS

| | | | |
|---|---|---|---|
| 5,102,821 A | 4/1992 | Moslehi | |
| 5,260,233 A | 11/1993 | Buti et al. | |
| 5,563,084 A | 10/1996 | Ramm et al. | |
| 5,904,507 A | 5/1999 | Thomas | |
| 5,909,618 A | 6/1999 | Forbes et al. | |
| 6,137,128 A | 10/2000 | Holmes et al. | |
| 6,191,476 B1 | 2/2001 | Takahashi et al. | |
| 6,229,161 B1 | 5/2001 | Nemati et al. | |
| 6,255,731 B1 | 7/2001 | Ohmi et al. | |
| 6,303,468 B1 | 10/2001 | Aspar et al. | |
| 6,335,258 B1 | 1/2002 | Aspar et al. | |
| 6,355,501 B1 | 3/2002 | Fung et al. | |

(Continued)

FOREIGN PATENT DOCUMENTS

| | | |
|---|---|---|
| JP | 06-104446 | 4/1994 |
| JP | 2003-030980 | 1/2003 |

(Continued)

OTHER PUBLICATIONS

U.S. Appl. No. 12/410,207, filed Mar. 24, 2009, Tang et al.

(Continued)

*Primary Examiner* — Hoai V Pham
(74) *Attorney, Agent, or Firm* — Wells St. John, P.S.

(57) ABSTRACT

Semiconductor arrays including a plurality of access devices disposed on a buried conductive line and methods for forming the same are provided. The access devices each include a transistor having a source region and drain region spaced apart by a channel region of opposite dopant type and an access line associated with the transistor. The access line may be electrically coupled with one or more of the transistors and may be operably coupled to a voltage source. The access devices may be formed in an array on one or more conductive lines. A system may be formed by integrating the semiconductor devices with one or more memory semiconductor arrays or conventional logic devices, such as a complementary metal-oxide-semiconductor (CMOS) device.

15 Claims, 14 Drawing Sheets

U.S. PATENT DOCUMENTS

| | | |
|---|---|---|
| 6,355,520 B1 | 3/2002 | Park et al. |
| 6,365,488 B1 | 4/2002 | Liao |
| 6,492,662 B2 | 12/2002 | Hsu et al. |
| 6,559,471 B2 | 5/2003 | Finder et al. |
| 6,600,173 B2 | 7/2003 | Tiwari |
| 6,713,791 B2 | 3/2004 | Hsu et al. |
| 6,744,094 B2 | 6/2004 | Forbes |
| 6,756,286 B1 | 6/2004 | Moriceau et al. |
| 6,809,044 B1 | 10/2004 | Aspar et al. |
| 6,888,199 B2 | 5/2005 | Nowak et al. |
| 6,906,354 B2 | 6/2005 | Hsu et al. |
| 6,946,365 B2 | 9/2005 | Aspar et al. |
| 6,953,953 B1 | 10/2005 | Horch |
| 6,995,456 B2 | 2/2006 | Nowak |
| 7,029,956 B2 | 4/2006 | Hsu et al. |
| 7,052,941 B2 | 5/2006 | Lee |
| 7,075,146 B2 | 7/2006 | Forbes |
| 7,115,939 B2 | 10/2006 | Forbes |
| 7,120,046 B1 | 10/2006 | Forbes |
| 7,157,771 B2 | 1/2007 | Forbes |
| RE39,484 E | 2/2007 | Bruel |
| 7,268,373 B1 | 9/2007 | Gupta et al. |
| 7,271,052 B1 | 9/2007 | Forbes |
| 7,279,740 B2 | 10/2007 | Bhattacharyya et al. |
| 7,323,380 B2 | 1/2008 | Forbes |
| 7,326,969 B1 | 2/2008 | Horch |
| 7,358,120 B2 | 4/2008 | Furukawa et al. |
| 7,359,229 B2 | 4/2008 | Ferrant et al. |
| 7,368,352 B2 | 5/2008 | Kim et al. |
| 7,410,867 B2 | 8/2008 | Forbes |
| 7,415,690 B2 | 8/2008 | Liang et al. |
| 7,440,310 B2 | 10/2008 | Bhattacharyya |
| 7,456,439 B1 | 11/2008 | Horch |
| 7,476,939 B2 | 1/2009 | Okhonin et al. |
| 7,488,627 B1 | 2/2009 | Nemati et al. |
| 7,491,608 B2 | 2/2009 | Forbes |
| 7,518,182 B2 | 4/2009 | Abbott et al. |
| 7,538,000 B2 | 5/2009 | Dao |
| 7,579,240 B2 | 8/2009 | Forbes |
| 7,589,995 B2 | 9/2009 | Tang et al. |
| 7,592,209 B2 | 9/2009 | Chang |
| 7,619,917 B2 | 11/2009 | Nirschl et al. |
| 7,838,360 B2 * | 11/2010 | Forbes .................. 438/238 |
| 2001/0002062 A1 | 5/2001 | Noble, Jr. et al. |
| 2001/0024841 A1 | 9/2001 | Noble, Jr. et al. |
| 2002/0070454 A1 | 6/2002 | Yasukawa |
| 2002/0158254 A1 | 10/2002 | Hsu et al. |
| 2002/0163019 A1 | 11/2002 | Mohsen |
| 2004/0159853 A1 | 8/2004 | Nemati et al. |
| 2004/0214379 A1 | 10/2004 | Lee et al. |
| 2005/0001232 A1 | 1/2005 | Bhattacharyya |
| 2005/0230356 A1 | 10/2005 | Empedocles et al. |
| 2006/0034116 A1 | 2/2006 | Lam et al. |
| 2006/0071074 A1 | 4/2006 | Konececki et al. |
| 2006/0099776 A1 | 5/2006 | Dupont |
| 2006/0125011 A1 | 6/2006 | Chang |
| 2006/0197115 A1 | 9/2006 | Toda |
| 2006/0227601 A1 | 10/2006 | Bhattacharyya |
| 2007/0023805 A1 | 2/2007 | Wells et al. |
| 2007/0045709 A1 | 3/2007 | Yang |
| 2007/0215954 A1 | 9/2007 | Mouli |
| 2007/0252175 A1 | 11/2007 | Tang et al. |
| 2007/0264771 A1 | 11/2007 | Ananthan et al. |
| 2008/0124867 A1 | 5/2008 | Brown |
| 2008/0128802 A1 | 6/2008 | Huo et al. |
| 2008/0211023 A1 | 9/2008 | Shino |
| 2008/0233694 A1 | 9/2008 | Li |
| 2008/0237776 A1 | 10/2008 | Abbott |
| 2008/0299753 A1 | 12/2008 | Figura et al. |
| 2009/0003025 A1 | 1/2009 | Makhleshi et al. |
| 2009/0010056 A1 | 1/2009 | Kuo et al. |
| 2009/0014813 A1 | 1/2009 | Chao et al. |
| 2009/0022003 A1 | 1/2009 | Song et al. |
| 2009/0026522 A1 | 1/2009 | Ananthan |
| 2009/0072341 A1 | 3/2009 | Liu et al. |
| 2009/0079030 A1 | 3/2009 | Cheng et al. |
| 2009/0108351 A1 | 4/2009 | Yang et al. |
| 2009/0170261 A1 | 7/2009 | Lee |
| 2009/0173984 A1 | 7/2009 | Wang |
| 2009/0200536 A1 | 8/2009 | Van Schaijk et al. |
| 2009/0201723 A1 | 8/2009 | Okhonin et al. |
| 2009/0207681 A1 | 8/2009 | Juengling |
| 2009/0213648 A1 | 8/2009 | Siesazeck |
| 2009/0218656 A1 | 9/2009 | Gonzalez et al. |
| 2009/0242865 A1 | 10/2009 | Lung et al. |

FOREIGN PATENT DOCUMENTS

| | | |
|---|---|---|
| KR | 10-2010-0070835 | 6/2010 |
| WO | PCT/US2011/024354 | 9/2011 |
| WO | PCT/US2011/024376 | 9/2011 |
| WO | PCT/US2011/024387 | 9/2011 |
| WO | PCT/US2012/021438 | 8/2012 |
| WO | PCT/US2011/024354 | 9/2012 |
| WO | PCT/US2011/024376 | 9/2012 |
| WO | PCT/US2011/024387 | 9/2012 |

OTHER PUBLICATIONS

U.S. Appl. No. 12/419,658, filed Apr. 7, 2009, Tang et al.
U.S. Appl. No. 12/715,704, filed Apr. 14, 2011, Tang et al.
U.S. Appl. No. 12/715,743, filed Mar. 2, 2010, Tang et al.
U.S. Appl. No. 12/715,889, filed Mar. 2, 2010, Tang et al.
U.S. Appl. No. 12/715,922, filed Mar. 2, 2010, Tang et al.
U.S. Appl. No. 12/715,843, filed Mar. 2, 2010, Tang et al.
Cho et al., A Novel Capacitor-Less DRAM Cell Using Thin Capacitively-Coupled Thyristor (TCCT), IEEE, 2005, 4 pages.
Nemati et al., A Novel High Density, Low Voltage SRAM Cell with a Vertical NDR Device, IEEE, 1998, 2 pages.
Sasago et al., "Cross-point phase change memory with 4F2 cell size driven by low-contact-resistivity poly-Si diode", Symposium on VLSI Technology Digest of Technical Papers, 2009, pp. 24-25.
Sugizaki et al., "35-nm Gate-Length and Ultra Low-voltage (0.45 V) Operation Bulk Thyristor-SRAM/DRAM (BT-RAM) Cell with Triple Selective Epitaxy Layers (TELs)", Symposium on VLSI Technology Digest of Technical Papers, 2008.
Suliman et al., Gate-Oxide Grown on the Sidewalls and Base of aU-Shaped Si Trench: Effects of the Oxide and Oxide/Si Interface Condition on the Properties of Vertical MOS Devices, Microelectronic Engineering, vol. 72, pp. 247-252; 2004.
Yang et al., High Performance CMOS Fabricated on Hybrid Substrate with Different Crystal Orientations, IEEE, 2003, 4 pages.
Yu et al., Low-Temperature Titanium-Based Wafer Bonding, Journal of the Electrocheical Society, vol. 154, No. 1, 2007, pp. H20-H25.

* cited by examiner

SEMICONDUCTOR CELLS, ARRAYS, DEVICES AND SYSTEMS HAVING A BURIED CONDUCTIVE LINE AND METHODS FOR FORMING THE SAME

CROSS-REFERENCE TO RELATED APPLICATIONS

This patent resulted from a divisional application of U.S. patent application Ser. No. 12/715,922, filed Mar. 2, 2010, entitled "Semiconductor Cells, Arrays, Devices and Systems Having a Buried Conductive Line and Methods for Forming the Same", naming Sanh D. Tanh as inventor, which is related to co-pending U.S. patent application Ser. No. 12/715,704, filed on Mar. 2, 2010, and titled "SEMICONDUCTOR-METAL-ON-INSULATOR STRUCTURES, METHODS OF FORMING SUCH STRUCTURES, AND SEMICONDUCTOR DEVICES INCLUDING SUCH STRUCTURES"; co-pending U.S. patent application Ser. No. 12/715,843, filed on Mar. 2, 2010, and titled "FLOATING BODY CELL STRUCTURES, DEVICES INCLUDING SAME, AND METHODS FOR FORMING SAME"; co-pending U.S. patent application Ser. No. 12/715,743, filed on Mar. 2, 2010, and titled "SEMICONDUCTOR DEVICES INCLUDING A DIODE STRUCTURE OVER A CONDUCTIVE STRAP, AND METHODS OF FORMING SUCH SEMICONDUCTOR DEVICES"; and co-pending U.S. patent application Ser. No. 12/715,889, filed on Mar. 2, 2010, and titled "THYRISTOR-BASED ACCESS DEVICES, DEVICES AND SYSTEMS INCLUDING THE SAME AND METHODS FOR FORMING THE SAME", the disclosures of which are incorporated herein by reference.

TECHNICAL FIELD

Embodiments of the present invention relate to semiconductor cells, arrays, devices and systems having substantially enhanced scalability, density and integration capacity and methods for forming such semiconductor devices.

BACKGROUND

Memory devices are typically provided as internal, semiconductor, integrated circuits in computers or other electronic devices. There are many different types of memory including random-access memory (RAM), read only memory (ROM), synchronous dynamic random access memory (SDRAM), dynamic random access memory (DRAM), and non-volatile memory. The trend in the semiconductor industry is toward smaller memory devices that may be used to fabricate high density circuits on a single chip. The miniaturization of transistor devices and circuits may be achieved by reducing the size of all the features of surface-oriented devices so that the resultant devices occupy a smaller surface area of a wafer.

FIG. 1 illustrates a conventional DRAM array 10 including an array of access devices 12 formed on a semiconductor substrate 14. Each of the access devices 12 includes a planar transistor 16 and a capacitor cell 13. Gate electrodes 18 and 19 for the transistors 16 are separated from a channel region 20 of the transistor 16 by an insulator, such as an oxide. The channel region 20 of the transistor 16 separates a source region 26 from a drain region 24. The drain regions 24 may each be electrically coupled to the capacitor cell by a first contact 28. A second contact 30 may be coupled to a voltage source. During operation, current flow between source region 26 and the drain region 24 is parallel to a major surface of the semiconductor substrate 14. Since the source and drain regions are formed in the semiconductor substrate 14, coupling of the access devices 12 of the DRAM array 10 requires that sufficient space remain between the transistors 16 such that the first contact 28 and the second contact 30 may be formed. Spacers 32 are formed on sidewalls of each of the transistors 16. The access devices 12 are isolated by shallow trench isolation ("STI") features 25 in the substrate 14. With the STI features isolating the cell, the conventional DRAM array 10 consumes excessive real estate (i.e., surface area) on the substrate 14. Furthermore, conventional access devices 12 of DRAM arrays 10 such as that shown in FIG. 1 occupy an area of greater than or equal to $6F^2$.

In order to achieve devices with higher packing density, it is possible to shrink the length and width of the channel region 20 of the transistors 16. However, there are several drawbacks to shrinking planar transistors 16 in access devices 12 of DRAM arrays 10, such as threshold voltage variation, short-channel effect ("SCE"), increase of substrate-bias effect due to impurity concentration enhancement in the channel region, and reliability degradation by hot-carriers. The narrow width transistors also cause decrease of current drivability and reliability degradation. The high parasitic resistance-capacitance ("RC") and inefficient interconnections of the narrow width transistors results in high external resistance.

Devices including vertical transistors have been proposed to overcome the limit in area of planar transistors 16 used in conventional DRAM arrays 10. Such vertical transistors include a channel region generally perpendicular to a major surface of a semiconductor substrate such that current flow between source and drain regions of transistors is substantially orthogonal to a major surface of a semiconductor substrate. However, conventional methods of manufacturing devices that include vertical transistors are complicated. For example, numerous masks are conventionally used to define elements of devices including vertical transistors, contacts to the source regions and drain regions and metal interconnects. Forming each of these masks is a time and cost intensive process. Therefore, conventional methods of forming memory devices including vertical transistors are not desirable due to high process costs and complexity.

DETAILED DESCRIPTION

Figure 1:
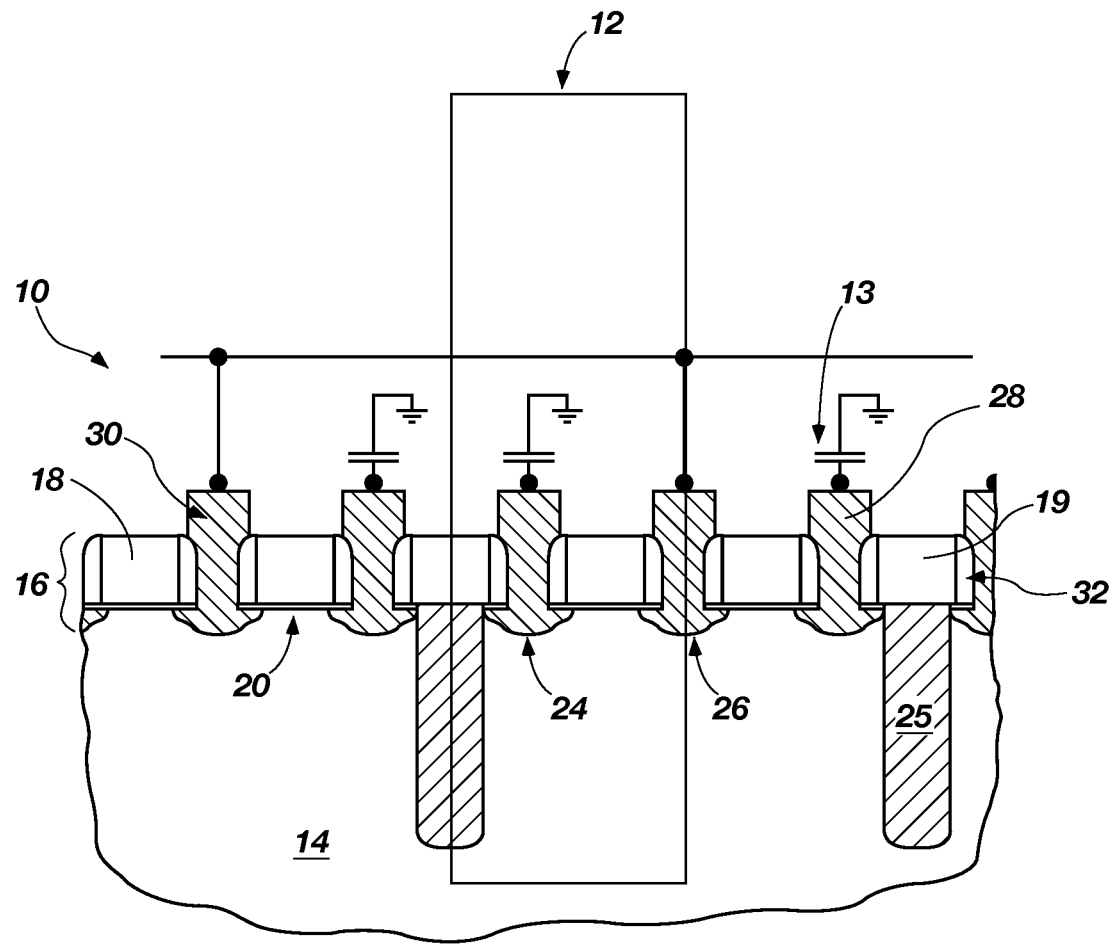
FIG. 1 illustrates a cross-sectional view of a DRAM array in accordance with the prior art.

Access devices, semiconductor devices and electrical systems including such access devices and methods for forming such access devices, devices and systems are disclosed. Such access devices include, for example, at least one transistor disposed on a conductive line and including a channel region interposed between a drain region and a source region. The access devices may further include an access line associated with the transistor. As used herein, the term "interposed" means and includes disposed between or situated between elements in such a manner that perimeters or outer surfaces thereof generally coincide. The conductive line may function as a data/sense line and provide an electrical connection to the transistor. The access devices may have a cell size of $4F^2$, wherein F is a minimum feature size, to provide semiconductor devices having improved scalability, reduced area and increased access device density. An upper region of the transistors may remain exposed for electrical interconnection, thus enabling increased transistor density in an array. As used herein, the term "scalability" means and includes an ability to improve transistor density in a memory array by decreasing an amount of substrate area utilized to implement various semiconductor structures on or in the substrate. The access devices and devices formed in accordance with various embodiments of the present disclosure may be integrated with one or more logic devices, such as a complementary metal-oxide-semiconductor (CMOS) device, and may be used in a system, such as, for example, a central processing unit (CPU), a system-on-a-chip (SOC), sensors, imagers, micro electro-mechanical systems (MEMS) and nano electro-mechanical systems (NEMS). Methods of forming such access devices and devices are provided. The methods may include a material transfer process and self-alignment that provide simplified fabrication and integration of the access devices and interconnection.

The following description provides specific details, such as material types and processing conditions, in order to provide a thorough description of embodiments of the present disclosure and implementation thereof. However, a person of ordinary skill in the art will understand that the embodiments of the present disclosure may be practiced without employing these specific details and in conjunction with conventional fabrication techniques. In addition, the description provided herein does not form a complete process flow for manufacturing a semiconductor device or system. Only those process acts and structures necessary to understand the embodiments of the present invention are described in detail herein. Additional acts to form a complete system or integrated circuit device including a semiconductor array or device according to an embodiment of the present disclosure may be performed by conventional techniques.

The materials described herein may be formed by a suitable technique including, but not limited to, spin-on coating, blanket coating, chemical vapor deposition ("CVD"), plasma enhanced chemical vapor deposition ("PECVD"), atomic layer deposition ("ALD"), plasma enhanced ALD, or physical vapor deposition ("PVD"). Alternatively, materials may be grown in situ. A technique suitable for depositing or growing a particular material may be selected by a person of ordinary skill in the art. While the materials described and illustrated herein may be formed as layers, the materials are not limited thereto and may be formed in other three-dimensional configurations.

The terms "horizontal" and "vertical," as used herein, define relative positions of elements or structures with respect to a major plane or surface of a wafer or substrate, regardless of the orientation of the wafer or substrate, and are orthogonal dimensions interpreted with respect to the orientation of the structure being described, as illustrated in the drawing being referred to when the structure is being described. As used herein, the term "vertical" means and includes a dimension substantially perpendicular to the major surface of a substrate or wafer as illustrated, and the term "horizontal" means a dimension substantially parallel to the major surface of the substrate or wafer as illustrated and extending between left and right sides of the drawing. Prepositions, such as "on," "over," "above" and "under," as used herein, are relative terms corresponding to the vertical direction with respect to the structure being described.

In the following detailed description, reference is made to the accompanying drawings, which form a part hereof, and in which is shown, by way of illustration, specific embodiments in which the invention may be practiced. These embodiments are described in sufficient detail to enable a person of ordinary skill in the art to practice the invention. However, other embodiments may be utilized, and structural, logical, and electrical changes may be made without departing from the scope of the invention. The illustrations presented herein are not actual views of any particular system, logic device, semiconductor device or access device, but are merely idealized representations which are employed to describe the embodiments of the present invention. The drawings presented herein are not necessarily drawn to scale. Additionally, elements common between drawings may retain the same numerical designation.

Figure 2A:
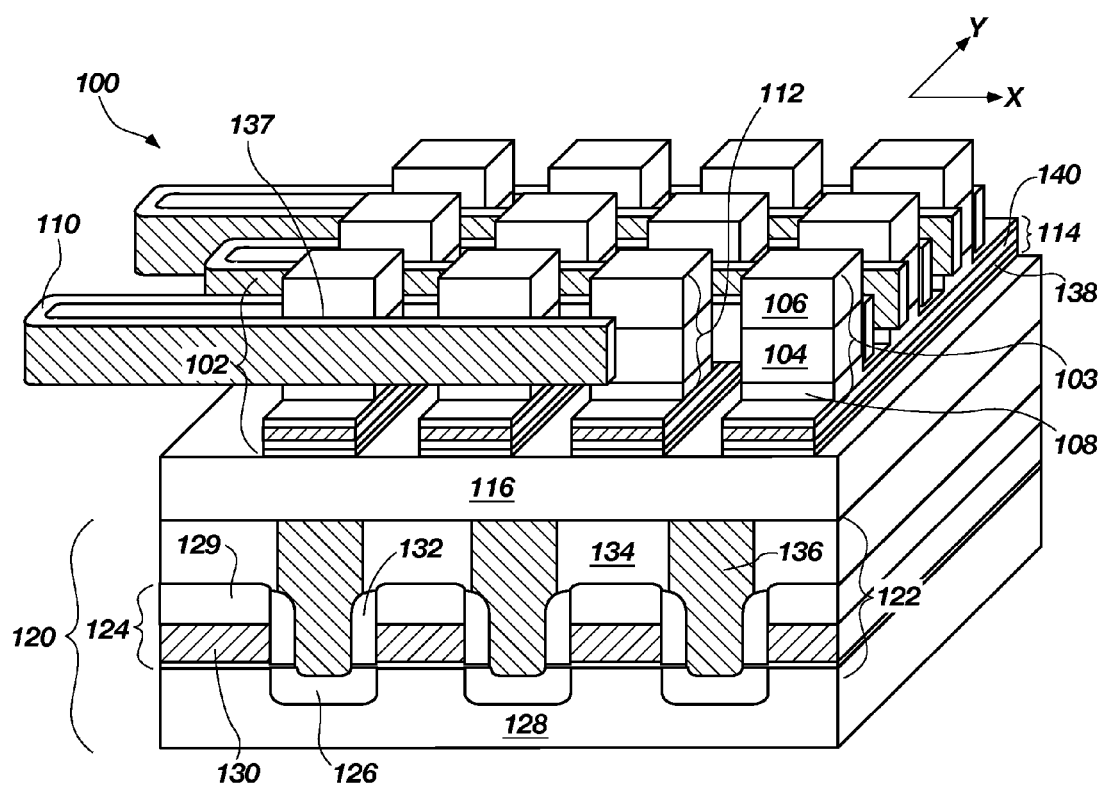
FIGS. 2A and 2B each illustrate a perspective view of a portion of a semiconductor array in accordance with an embodiment of the present disclosure.

FIG. 2A is an illustration of a semiconductor array 100 that includes a plurality of access devices 102, each including a transistor 103 having a channel region 104 interposed between a drain region 106 and a source region 108. The access devices 102 may each comprise, for example, an access field-effect transistor (FET). The transistor 103 of each of the access devices 102 may be associated with a gate electrode 110 (i.e., word lines) and may be disposed on a conductive line 114 (i.e., bit lines). For the sake of clarity, active elements are shown in the drawings with cross-hatching. As configured, the conductive lines 114 are self-aligned and are positioned beneath the transistors 103, leaving an upper region of the transistors 103 exposed for electrical interconnection of the semiconductor array 100. Accordingly, the self-aligned portions of the conductive lines 114 provide improved scalability by enabling increased transistor 103 density in the semiconductor array 100. The drain region 106 and the source region 108 of each transistor 103 may be spaced apart by the channel region 104 in a pillar 112 of semiconductor material formed on one of the conductive lines 114. The drain region 106 may be vertically superposed over an upper region of the channel region 104 and the channel region 104 may be vertically superposed over an upper region of the source region 108. A lower region of the source region 108 may be vertically superposed over the underlying conductive line 114. As used herein, the term "vertically superposed" means and includes a material(s) disposed atop or situated one upon another in such a manner that perimeters or outer surfaces thereof generally coincide.

Those skilled in the art will understand that the semiconductor regions, e.g., channel regions 104, source regions 108 and drain regions 106, described herein may be formed from materials having different conductivity types. Each of the channel regions 104 may be formed from a doped silicon material and may be oppositely doped with respect to the drain region 106 and the source regions 108. As used herein, the term "oppositely doped" means that one of the channel region 104, the drain region 106 and the source region 108 includes a surplus of positive charge carriers (p-type), while the adjacent region(s) includes a surplus of negative charge carriers (n-type). For example, channel region 104 may include a p-type silicon material while the drain region 106 and the source region 108 may each include an n-type silicon material.

During operation of the access devices 102, a high voltage may be applied to the transistor 103 via the associated gate electrode 110 and a depletion region may form. The term "depletion region" refers to a region within the transistor 103, such as channel region 104, depleted of mobile charge carriers. A thickness or dopant concentration of the channel regions 104, the drain regions 106 and the source regions 108 may be adjusted or optimized to form a fully depleted FET, as will be described herein. As used herein, the term "fully depleted" means and includes a semiconductor material depleted of mobile charge carriers during operation such that a depletion region from a p-n junction substantially completely covers a doped region. In a partially depleted region, a narrow n region is formed providing a channel region 104 that conducts or bridges between the source region and the drain region. A so-called "fully depleted" region the entire channel region 104 is inverted and, thus, conducts charge. The fully depleted region has no mobile charge carriers; it cannot be electrically biased and has essentially infinite lateral resistance so that adjacent portions are completely isolated. In one embodiment, the channel region 104 of each of the transistors 103 may have a thickness less than or equal to a maximum width of depletion region within the channel region 104 during operation thereof. During operation, the charge carriers (i.e., dopants) may be fully depleted from the channel regions 104.

In the semiconductor array 100 of the present disclosure, electrical interconnection of the source regions 108 of the transistors 103 is provided by the buried conductive lines 114, and electrical interconnection of the drain regions 106 of the transistors 103 may be formed on exposed upper surfaces thereof. Accordingly, the semiconductor array 100 does not utilize electrical contacts (i.e., contact plugs) that extend to the substrate, which provides improved scalability in comparison to the conventional DRAM array 10 shown in FIG. 1. To form the conventional DRAM array 10 shown in FIG. 1, spaces between the transistors 16 must have a width sufficient to space the contact plugs 28 and the gate electrodes 18 and 19 that extend to the source regions 24 and drain regions 26 in the substrate 14. In addition, as will be described in further detail, a simplified method of forming a semiconductor device, such as a DRAM, using the semiconductor array 100 is provided by eliminating additional processing acts utilized to form electrical contacts to the source and drain regions in a conventional DRAM array.

As a non-limiting example, the access devices 102 may be arranged in an array that includes a plurality of rows extending in a first direction X and a plurality of columns extending in a second direction Y. The semiconductor array 100 shown in FIG. 2A includes four (4) rows and four (4) columns. However, as configured, the semiconductor array 100 may include any number of rows and columns. Additionally, the rows of access devices 102 aligned in the first direction X may be substantially perpendicular to the columns of access devices 102 aligned in the second direction Y. A distance between the transistor 103 of one of the access devices 102 and the transistor 103 of an adjacent access device 102 in the first direction X and in the second direction Y may be equal to a pitch, or feature size (2F), of the pillar 112 of the transistor 103 so that a cell size of each access device 102 is less than or equal to $4F^2$. As configured, the access devices 102 may each occupy a $4F^2$ area having a square shape or a rectangular shape.

As a non limiting example, each of the conductive lines 114 may extend in the second direction Y, and each of the transistors 103 aligned in one of the columns may be disposed on a single conductive line 114. The conductive lines 114 may be formed on an electrically insulative material 116. For simplicity, the electrically insulative material 116 is hereinafter referred to as insulative material 116. The insulative material 116 on which the semiconductor array 100 is disposed may overlie an acceptor wafer 120, which may include an at least partially fabricated conventional logic device, such as a complementary metal-oxide-semiconductor (CMOS) device 122. For example, the CMOS device 122 may include an array of FETs 124 disposed between source and drains regions 126 in a bulk substrate 128. Each of the FETs 124 may include a gate dielectric 129 and a gate electrode 130 disposed between spacers 132. A dielectric material 134 may, optionally, be formed between the bulk substrate 128 and the gate electrode 130 of each of the FETs 124. The CMOS device 122 may further include a plurality of line interconnects 136 interconnecting the FETs 124.

The gate electrodes 110 may each include a conductive material and may each be disposed over at least one sidewall of the pillars 112. A gate dielectric 137 may be disposed between the gate electrodes 110 and each of the associated pillars 112. As a non-limiting example, the gate electrodes 110 may extend in the first direction X and may be disposed over at least one of the sidewalls of the pillars 112 aligned in the rows extending in the first direction X.

Each of the conductive lines 114 may include a silicon material 138 and a conductive material 140 and may be disposed between the insulative material 116 and the source regions 108 of the access devices 102 of the semiconductor array. The conductive lines 114 may function as electrical interconnects to the access devices 102 of the semiconductor array 100. The conductive lines 114 may each extend in the second direction Y, underlying at least one of the columns of access devices 102 in the semiconductor array 100. Thus, the conductive lines 114 may be aligned in a direction substantially perpendicular to the gate electrodes 110. Each of the conductive lines 114 may enable the semiconductor array 100 to be electrically coupled with an underlying or overlying conventional logic device, such as the CMOS device 122.

During use and operation of the semiconductor array 100, the gate electrodes 110 may be biased using the voltage source such that a depletion region is created, providing current flow from the source region 108 to the drain region 106 of each of the access devices 102. The conductive lines 114 may each function as a data/sense line (i.e., bit line) and, during operation of the semiconductor array 100, may create a forward bias electrically coupling the access devices 102 of the semiconductor array 100.

Figure 2B:
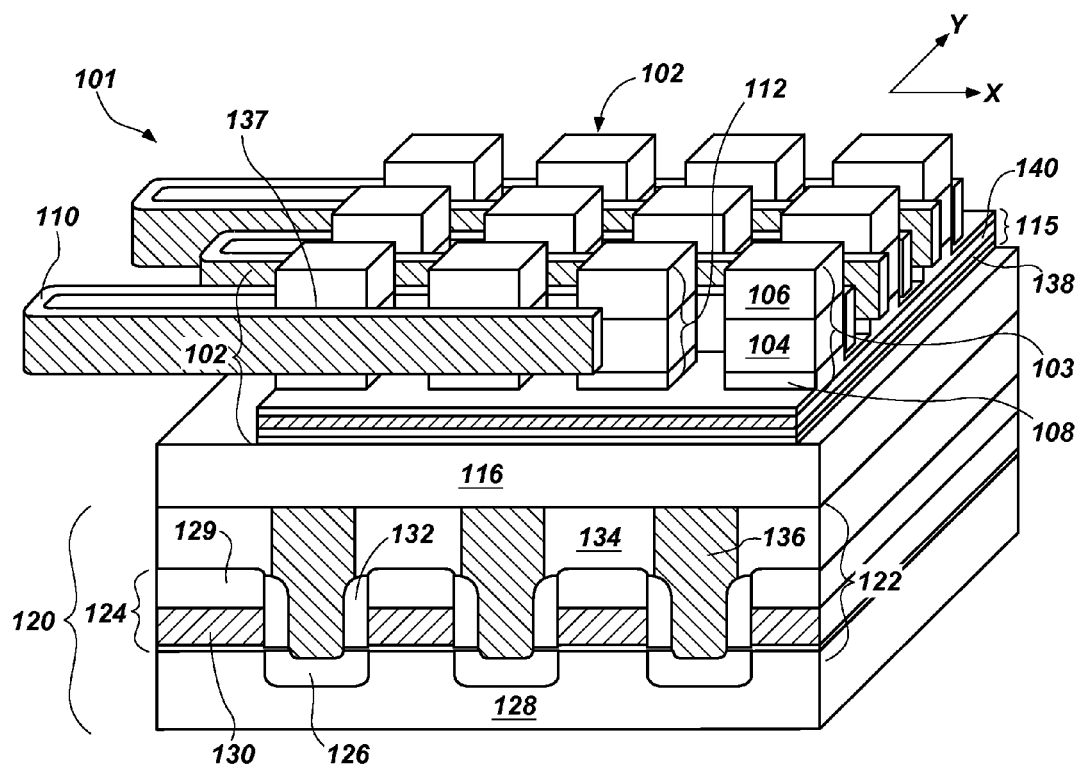

FIG. 2B is an illustration of a semiconductor array 101 having a configuration similar to that of the semiconductor array 100 shown in FIG. 2A with the exception of the conductive lines 114. Instead of conductive lines 114, the array of access devices 102 may be disposed on a global source line 115 such that the semiconductor array 101 may be integrated with another at least partially formed memory device, such as a resistive random access memory (RRAM) device or a phase-change random access memory (PcRAM) device via one or more data/sense lines (not shown) electrically coupled to the drain region 106 of one or more of the access devices 102. The global source line 115 may include the silicon material 138 and the conductive material 140. As configured, the global source line 115 improves scalability of the semiconductor array 101 by enabling electrical interconnection to exposed upper regions of the drain regions 106 of the semiconductor array 101.

The access devices 102 of the semiconductor arrays 100 and 101 shown in FIGS. 2A and 2B may have a cell size of less than or equal to $4F^2$, wherein F is a feature size of the pillar 112. As configured, the source regions 108 are electrically coupled by the conductive lines 114, leaving an entire feature size of the drain regions 106 available for electrical coupling to conductive structures.

Figure 3:
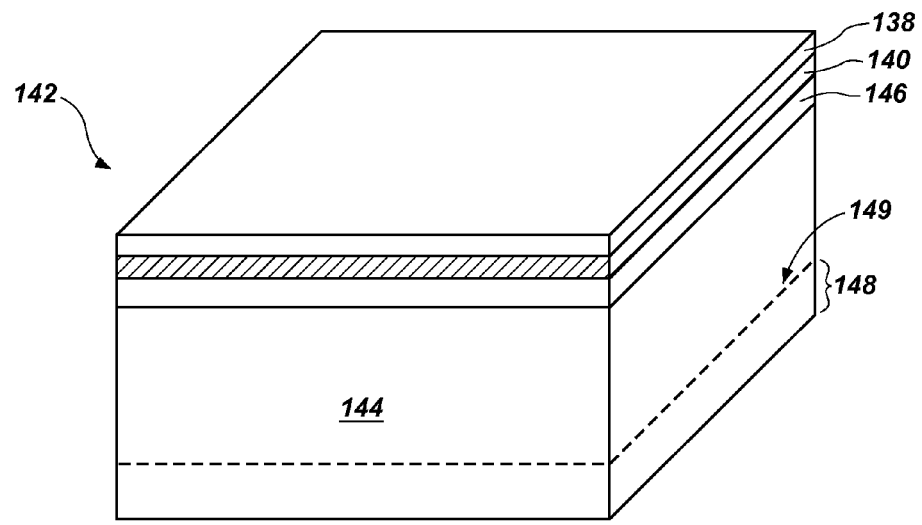
FIGS. 3 through 12 illustrate perspective and cross-sectional views of a portion of a semiconductor array during various stages of fabrication in accordance with embodiments of the present disclosure.

With reference to FIGS. 3-10, a method of forming the semiconductor arrays 100 and 101 shown in FIGS. 2A and 2B will now be described, wherein like elements are designated by like numerals. As shown in FIG. 3, a donor wafer 142 may be formed that includes a substrate 144 having a doped material 146, the conductive material 140 and the silicon material 138 formed thereon. The substrate 144 may include a fabrication substrate, such as a full or partial wafer of semiconductor material (e.g., silicon, gallium arsenide, indium phosphide, etc.), a full or partial silicon-on-insulator (SOI) type substrate, such as a silicon-on-glass (SOG), silicon-on-ceramic (SOC), or silicon-on-sapphire (SOS) substrate, or any other known, suitable fabrication substrate. As used herein, the term "wafer" includes conventional wafers as well as other bulk semiconductor substrates. In one embodiment, the substrate 144 may include a crystalline silicon material. The substrate 144 may be doped or undoped. For example, the substrate 144 may be doped with an n-type material that may later form the channel region 104 of each of the access devices 102 of the semiconductor arrays 100 and 101 shown in FIGS. 2A and 2B.

For example, the doped material 146 may include a doped crystalline silicon material, such as an n-type silicon material or a p-type silicon material. The doped material 146 may be formed by performing a conventional ion implantation on the substrate 144. In one embodiment, the doped material 146 may be formed to include a p-type material by implanting ions of a p-type impurity, such as boron (B), into the substrate 144. The doped material 146 including the p-type material may be used to form the source regions 108 of the semiconductor arrays 100 and 101 shown in FIGS. 2A and 2B, as will be described in further detail. The doped material 146 may be formed before or after the conductive material 140 and the silicon material 138 have been formed on the donor wafer 142.

The conductive material 140 may be a low resistivity material including, but not limited to, titanium, titanium silicide, titanium nitride, tantalum, tantalum silicide, tantalum nitride, tungsten, tungsten silicide, tungsten nitride, other metal, metal silicide, conductive metal oxide, or metal nitride materials, or combinations thereof, including multiple, different conductive materials. In one embodiment, the conductive material 140 may be formed from titanium silicide and titanium nitride because titanium silicide makes good ohmic contact with silicon and titanium nitride has good adherence or adhesion to many materials, such as the material used as the substrate 144. Titanium nitride also makes excellent ohmic contact with other conductive materials. Titanium nitride is also commonly used in semiconductor fabrication and, therefore, may easily be incorporated into conventional fabrication processes. In one embodiment, the conductive material 140 is a titanium-rich titanium nitride, such as metal mode titanium nitride (MMTiN). The conductive material 140 may also be formed from multiple conductive materials. In another embodiment, the conductive material 140 may be formed from a metal, such as titanium, tungsten, tungsten silicide or aluminum, with a layer of titanium material formed thereon. The thickness of the conductive material 140 may be optimized, depending on the material, to provide a low ohmic contact. For example, if the conductive material 140 is titanium nitride, such as MMTiN, the conductive material 140 may have a thickness of from about 10 nm to about 50 nm. The conductive material 140 may be formed by a deposition technique known in the art, such as, for example, atomic layer deposition (ALD), chemical vapor deposition (CVD), or plasma vapor deposition (PVD).

As a non-limiting example, the silicon material 138 may include an amorphous silicon material or a polysilicon material. The silicon material 138 may be formed over the conductive material 140 by a deposition technique known in the art, such as, for example, ALD, CVD, or PVD. In one embodiment, the silicon material 138 may be formed on the conductive material 140 by PVD, followed by chemical mechanical planarization (CMP). For example, the thickness of the silicon material 138 may be from about 10 nm to about 50 nm.

The donor wafer 142 may also include a transfer region 148 formed by implanting an atomic species into the substrate 144. The atomic species may be hydrogen ions, ions of rare gases, also termed inert or noble gases, or ions of fluorine. The atomic species may be implanted into the substrate 144 of the donor wafer 142 to form an implanted zone 149, represented in FIG. 3 by broken lines. The atomic species may be implanted into the substrate 144 before or after the conductive material 140 or the silicon material 138 are formed on the substrate 144. The implanted zone 149 may be formed at a desired depth in the substrate 144, which is dependent on parameters, such as implant dose and energy of the atomic species, as known in the art. The depth at which the implanted zone 149 is formed may correspond to the desired thickness of channel regions 104 of the semiconductor arrays 100 and 101 shown in FIGS. 2A and 2B. The implanted zone 149 may include microbubbles or microcavities including the implanted atomic species, which provide a weakened region within the substrate 144. The donor wafer 142 may be thermally treated at a temperature above that at which implantation is effected, but below the melting temperature of the conductive material 140, to effect crystalline rearrangement in the donor wafer 142 and coalescence of the microbubbles or microcavities. As described below, the donor wafer 142 may be cleaved at the implanted zone 149 to form the semiconductor structure 150 shown in FIG. 4.

Figure 4:
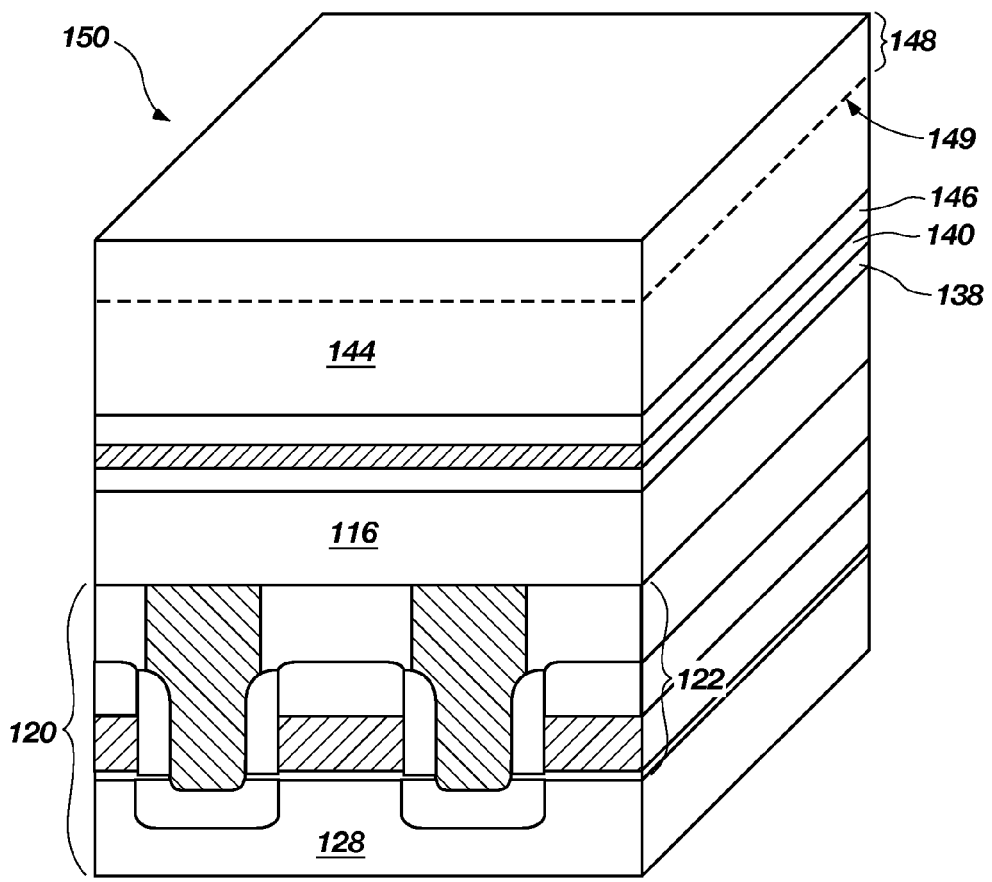

As shown in FIG. 4, the donor wafer 142 may be superposed onto the insulative material 116 overlying the acceptor wafer 120 such that the silicon material 138 of the donor wafer 142 is in contact with the insulative material 116 of the acceptor wafer 120. To form the acceptor wafer 120, the insulative material 116 may be formed over a bulk substrate 128 using a conventional deposition technique known in the art, such as, for example, ALD, CVD, or PVD. For example, the bulk substrate 128 may include a silicon substrate. An at least partially fabricated conventional logic device, such as the CMOS device 122, may, optionally, be formed on the bulk substrate 128 and may be formed by conventional techniques. Positioning the CMOS device 122 over or under the semiconductor array 100 rather than on the substrate 144 provides additional area for forming the CMOS device 122 and the semiconductor array 100. Fabricating the acceptor wafer 120 to include the CMOS device 122 provides simplified integration of the CMOS device 122 and may substantially reduce a final die size by, for example, greater than or equal about 10%.

The silicon material 138 of the donor wafer 142 may then be bonded to the insulative material 116 of the acceptor wafer 120 by exposure to heat. Prior to bonding the donor wafer 142 to the acceptor wafer 120, at least one of a surface of the silicon material 138 and a surface of the insulative material 116 may, optionally, be treated to improve the bond strength therebetween. Such treatment techniques are known in the art and may include, for example, chemical activation, plasma activation or implant activation. For example, the surface of the insulative material 116 may be treated with a dilute ammonia hydroxide or hydrogen fluoride solution. The surface of the silicon material 138 may also be exposed to a plasma of, for example, argon, to form a plasma-activated surface. Activating at least one of the surface of the amorphous silicon and the surface of the insulative material 116 may increase the kinetics of the subsequent bonding therebetween due to an increased mobility of ionic species (for example, hydrogen) created on the surface of the silicon material 138 and the surface of the insulative material 150.

Figure 5:
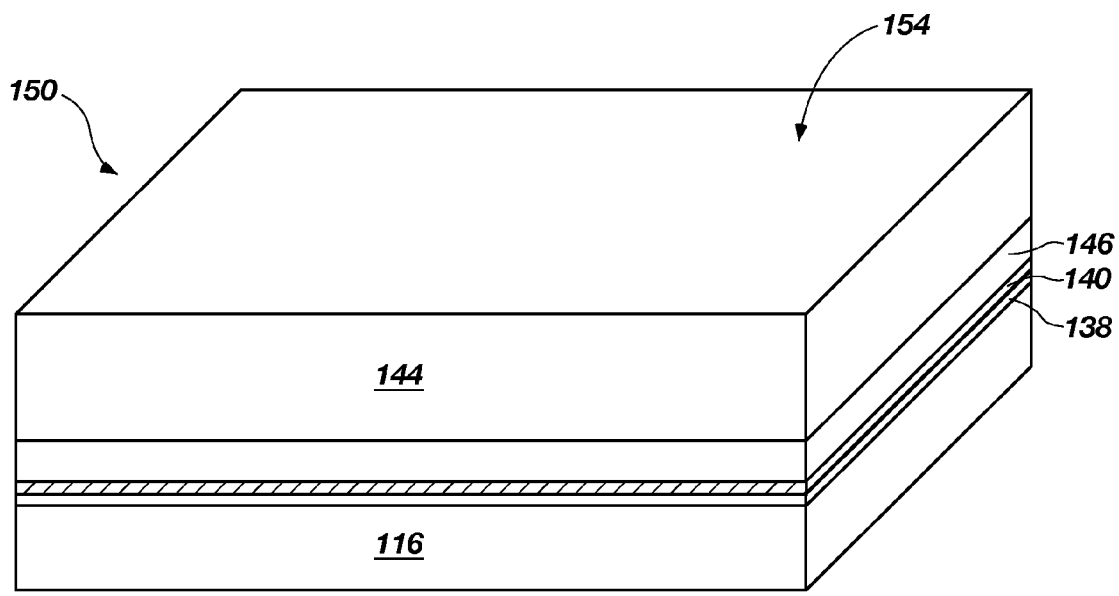

Referring still to FIG. 4, the silicon material 138 of the donor wafer 142 may be contacted and bonded with the insulative material 116 of the acceptor wafer 120 to form the semiconductor structure 150 (FIG. 5). In some embodiments, the silicon material 138 may be bonded to the insulative material 116 without heat, such as at ambient temperature (from about 20° C. to about 25° C.). Pressure may also be applied to the donor wafer 142 and the acceptor wafer 120 to bond the silicon material 138 to the insulative material 116. Once the donor wafer 142 is bonded to the acceptor wafer 120, the conductive material 140 from the donor wafer 142 may form a buried conductive material, which is disposed between the insulative material 116 and the substrate 144.

The transfer region 148 may then be removed from the substrate 144, to form the semiconductor structure 150 shown FIG. 5. For the sake of simplicity, the acceptor wafer 120 underlying the insulative material 116 in the preceding figures has been omitted from the remaining figures. The transfer region 148 may be removed by techniques known in the art, such as by applying a shear force to the implanted zone 149 (FIG. 4) or by applying heat or a jet gas stream at the implanted zone 149. For example, the transfer region 148 may then be removed from the substrate 144 by, for example, heating the semiconductor structure 150 to a temperature of less than about 600° C., such as from about 300° C. to about 400° C. The hydrogen or other ions implanted in implanted zone 149 produce a weakened region in the substrate 144, which is susceptible to cleavage. The remaining portion of the substrate 144 may have a thickness, for example, of from about 50 nm to about 30 nm (from about 500 Å to about 3000 Å). After separation of the transfer region 148 from the remaining portion of the substrate 144, an exposed surface 154 of the substrate 144 may be undesirably rough. The exposed surface 154 of the substrate 144 may be smoothed to facilitate further processing according to techniques known in the art such as, for example, one or more of grinding, wet etching, and chemical-mechanical polishing (CMP).

The semiconductor structure 150 may be formed by modification of SMART-CUT® layer transfer technology. The SMART-CUT® layer transfer technology is described in detail in, for example, U.S. Pat. No. RE 39,484 to Bruel, U.S. Pat. No. 6,303,468 to Aspar et al., U.S. Pat. No. 6,335,258 to Aspar et al., U.S. Pat. No. 6,756,286 to Moriceau et al., U.S. Pat. No. 6,809,044 to Aspar et al., U.S. Pat. No. 6,946,365 to Aspar et al., and U.S. Patent Application Publication No. 2006/0099776 to Dupont. Other processes suitable for manufacturing a semiconductor structure having a buried conductive material may also be used, if sufficiently low process temperatures are maintained. In conventional implementation of the SMART-CUT® layer transfer technology, donor wafers and acceptor wafers are bonded together using a high temperature anneal. The temperature used to bond the donor and acceptor wafers is from about 1000° C. to about 1300° C. However, due to the presence of the conductive material 140 in the semiconductor structure 150 described herein, the semiconductor structure 150 of the present disclosure would be unable to withstand exposure to such temperatures without thermal damage. Accordingly, as described above, lower temperatures may be used to bond acceptor wafer 120 and donor wafer 142. Furthermore, forming the substrate 144 and the doped region 146 prior to the bonding and material transfer process described with respect to FIGS. 4 and 5 thus provides improved optimization and control of the concentration and distribution of dopants in the semiconductor arrays 100 and 101 shown in FIGS. 2A and 2B.

Methods for forming the semiconductor structure 150 are similar to those described in detail in U.S. patent application Ser. No. 12/715,704, filed on Mar. 2, 2010, and titled "SEMICONDUCTOR METAL-ON-INSULATOR STRUCTURES, METHODS OF FORMING SUCH STRUCTURES, AND SEMICONDUCTOR DEVICES INCLUDING SUCH STRUCTURES." While FIGS. 4 and 5 illustrate one embodiment of a method of forming the semiconductor structure 150, any of the methods described in U.S. patent application Ser. No. 12/715,704, or other known methods may be utilized to form the semiconductor structure 150 or a similar semiconductor structure. By enabling formation of the semiconductor arrays 100 and 101 shown in FIGS. 2A and 2B over an at least partially fabricated conventional logic device, such as the CMOS device 122, the disclosed methods provide a reduction in final die size of a fully or partially integrated semiconductor memory.

Figure 6A:
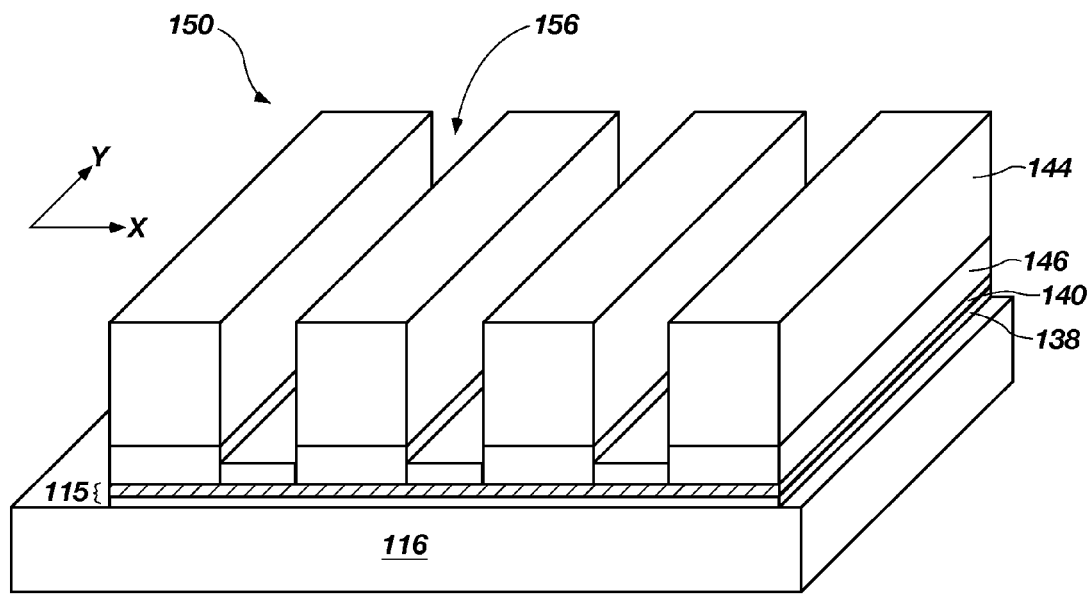

Referring to FIG. 6A, portions of the substrate 144 and the doped material 146 may be removed to form trenches 156. The trenches 156 may be formed by depositing a mask material (not shown) over the substrate 144 and patterning the mask material to form apertures through which surfaces of the substrate 144 are exposed. The mask material may include, for example, a photoresist material, an oxide material, transparent carbon or amorphous carbon. Methods of forming and patterning the mask material are known in the art and, therefore, are not described in detail herein. Portions of the substrate 144 exposed through the apertures in the mask material and the underlying doped material 146 may be removed to form the trenches 156 between remaining portions of each of the substrate 144 and the doped material 146. The remaining portions of the mask material may then be removed. In one embodiment, the conductive material 140 and the silicon material 138 may remain intact on the insulative material 116 to form the global source line 115 of the semiconductor array 101 shown in FIG. 2B.

By way of non-limiting example, the trenches 156 may be formed extending in the second direction Y through the substrate 144 and at least a portion of the doped material 146. Portions of the substrate 144 and the doped material 146 may be removed using, for example, an anisotropic reactive ion (i.e., plasma) etching process. For example, if the substrate 144 and the doped material 146 are each formed from a doped silicon material, a reactive ion etching (RIE) process using oxygen ($O_2$) gas and tetrafluoromethane ($CF_4$) gas may be performed to selectively remove portions of the doped silicon material selective to the mask material.

Figure 6B:
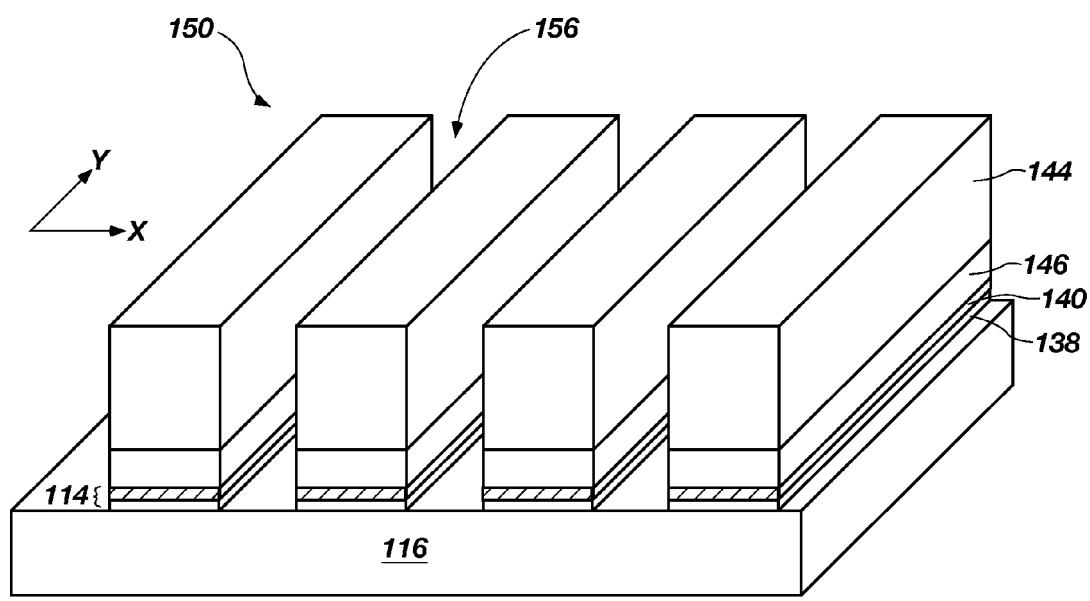

In other embodiments, after forming the trenches 156 in the substrate 144 and the doped material 146, portions of the conductive material 140 and the silicon material 138 may, optionally, be removed to form the conductive lines 114, as shown in FIG. 6B. The conductive lines 114 may each function as a data/sense line (i.e., a bit line) in the semiconductor array 100 shown in FIG. 2A. For example, if the conductive material 140 is formed from titanium nitride, a reactive ion etching (RIE) process using a mixture of a bromine-containing gas and a fluorine-containing gas or a mixture of a fluorine-containing gas and a chlorine-containing gas may be performed to remove the titanium nitride. If the silicon material 138 is formed from amorphous silicon, for example, a reactive ion etching (RIE) process using oxygen gas and tetrafluoromethane gas may be performed to selectively remove portions of the amorphous silicon selective to the mask material. Optionally, a portion of the insulative material 116 may be removed during the process used to remove the silicon material 138. Removal of each of the substrate 144, the doped material 146, the conductive material 140, the silicon material 138 using a single mask enables self-aligned formation of the conductive lines 114. The self-aligned formation of the conductive lines 114 reduces or eliminates processing acts and, thus, improves efficiency of fabrication while reducing cost. After forming the trenches 156 and, optionally, the conductive lines 114, the mask material may be removed from the semiconductor structure 150 to expose the underlying insulative material 116.

Figure 7:
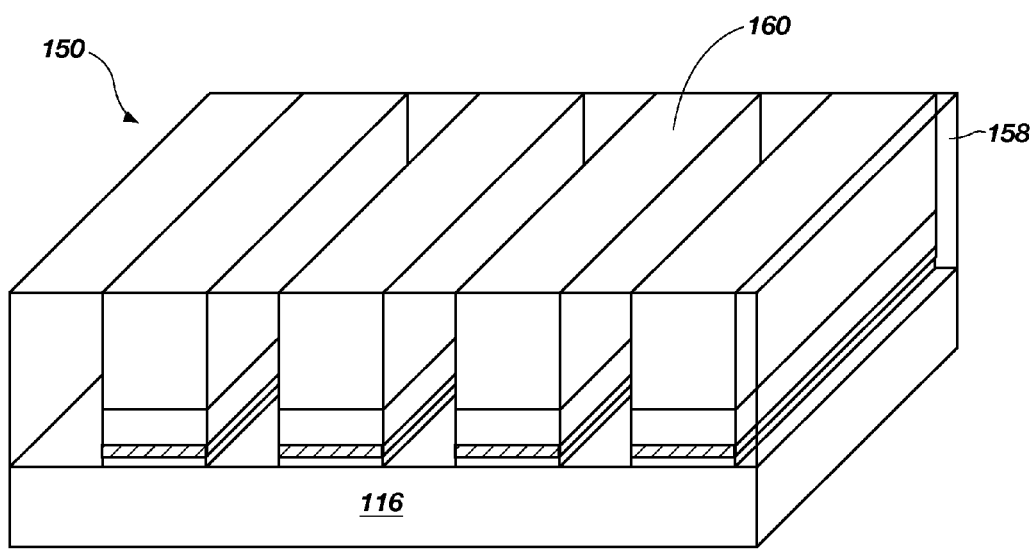

As shown in FIG. 7, a fill material 158 may be formed over the semiconductor structure 150. For the sake of simplicity, the following method acts are illustrated using the semiconductor structure 150 shown in FIG. 6B, which may be used to form the semiconductor array 100 shown in FIG. 2A. However, similar acts may be performed using the semiconductor structure 150 shown in FIG. 6A to form the semiconductor array 101 shown in FIG. 2B. By way of non-limiting example, the fill material 158 may include a dielectric material, such as an oxide material, a nitride material or a spin-on-glass (SOG) material, and may be deposited using a chemical vapor deposition process. After forming the fill material 158, a chemical-mechanical polishing (CMP) process may be used to remove portions thereof so that an upper surface 160 of the semiconductor structure 150 is substantially planar.

Figure 8:
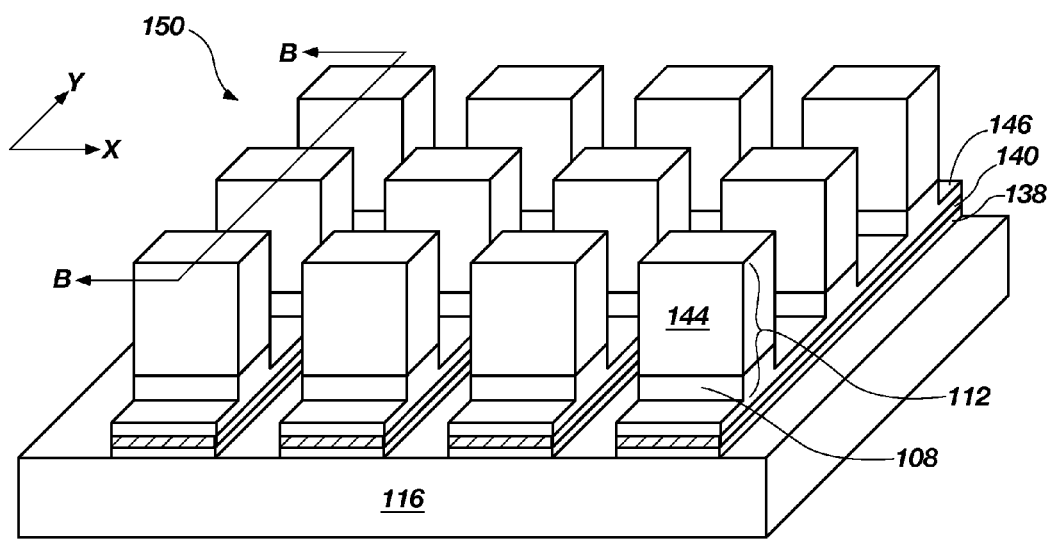

FIG. 8 shows the semiconductor structure 150 after portions of the substrate 144 and the doped material 146 have been removed in the first direction X to define the pillars 112, each including one of the source regions 108. In the remaining figures, the fill material 158 has been omitted for simplicity and clarity of illustration. The pillars 112 may be formed by depositing a mask material (not shown) over the semiconductor structure 150 and patterning the mask material to form apertures through which surfaces of the substrate 144 are exposed. Optionally, surfaces of the fill material 158 (FIG. 7) may be exposed through the mask material. The mask material may include, for example, a photoresist material, an oxide material, transparent carbon or amorphous carbon. Methods of forming and patterning the mask material are known in the art and, therefore, are not described in detail herein. Portions of the substrate 144 exposed through the apertures in the mask material and the underlying doped material 146 may be removed to form the pillars 112. For example, if the substrate 144 and the doped material 146 are each formed from a doped silicon, a reactive ion etching (RIE) process may be performed to selectively remove portions of the doped silicon. Each of the pillars 112 may be formed to have an aspect ratio of from about 1:7 to about 1:12. The pillars 112 shown in FIG. 8 are formed by partially removing the doped material 146 such that remaining portions thereof define the source regions 108. Forming the doped region 146 in the substrate 144 prior to the wafer bonding and transfer process described with respect to FIGS. 4 and 5 enables the dopant concentration and distribution to be optimized. In one embodiment, a portion of the source region 108 may extend over the conductive lines 114 between pillars 112. However, in other embodiments (not shown), the doped material 146 may be completely removed to expose surfaces of the conductive lines 114 between each of the pillars 112. The pillars 112 may be formed in an array that includes a plurality of rows in which the pillars 112 are aligned in the first direction X and a plurality of columns in which the pillars 112 are aligned in the second direction Y.

Figure 9A:
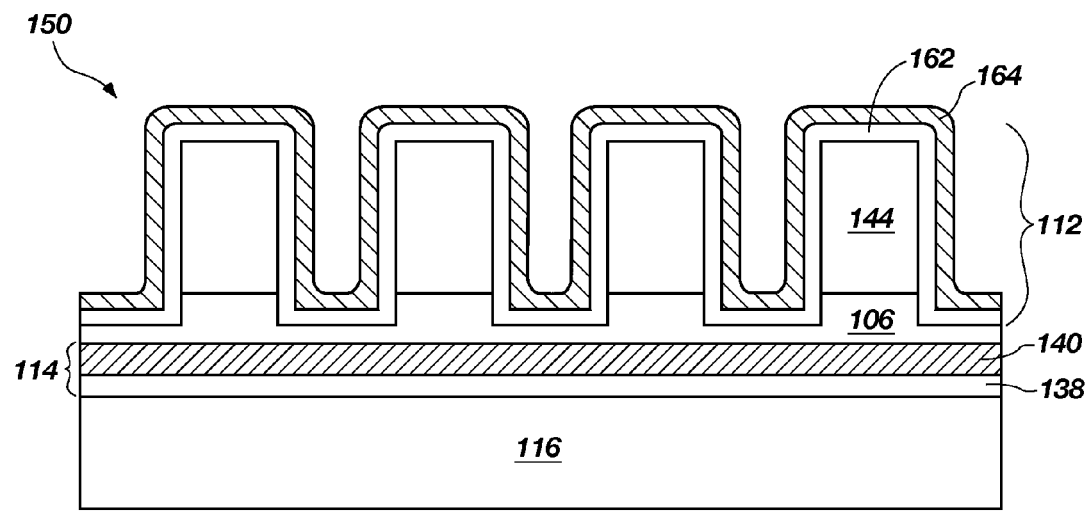
Figure 9B:
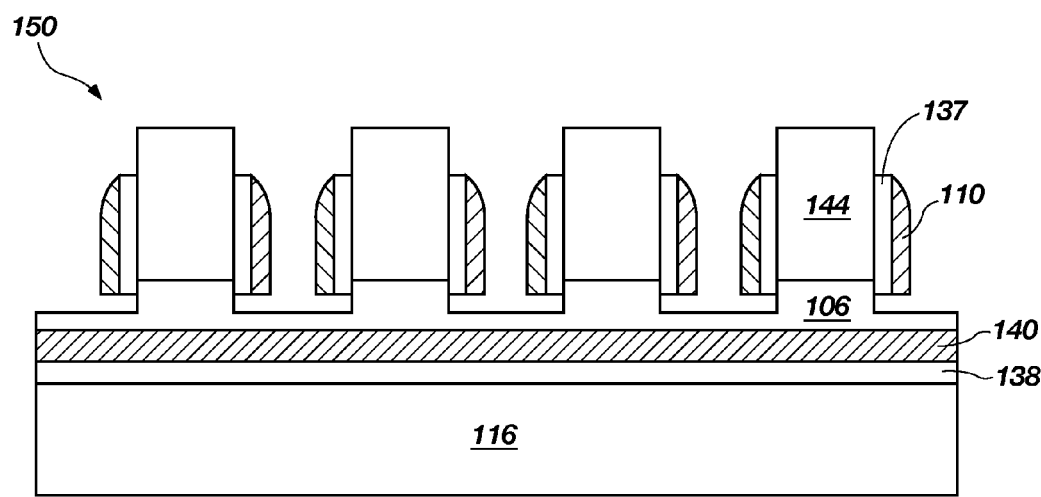

FIGS. 9A and 9B are cross-sectional views of the semiconductor structure 150 shown in FIG. 8 taken along section line B-B and illustrate an embodiment of a method of forming the gate electrodes 110 (FIG. 10) on the pillars 112. As shown in FIG. 9A, an optional gate dielectric material 162 and a gate material 164 may be formed over the semiconductor structure 150. By way of non-limiting example, the gate dielectric material 162 may be an oxide material, a nitride material or metal oxide formed using, for example, a chemical vapor deposition process or a thermal oxidation process. For example, if the gate dielectric material 162 is silicon dioxide, the semiconductor structure 150 may be exposed to oxygen gas at a temperature of from about 900° C. to about 1175° C. to form silicon dioxide on exposed regions of the pillars 112. The gate material 164 may then be formed over the gate dielectric material 162. As a non-limiting example, the gate material 164 may be formed from titanium nitride, tantalum nitride or tungsten and may be deposited using a chemical vapor deposition process. Referring to FIG. 9B, an anisotropic dry etching process may be performed to remove portions of the gate material 164 and the gate dielectric material 162 to form the gate electrodes 110. Those skilled in the art will understand that the gate electrodes 110 and, if present, the gate dielectric 137, may be formed on the sidewalls of the pillars 112 using any other technique known in the art. The conductive lines 114 and the gate electrodes 110 may, therefore, be formed by the disclosed method using as few as two masking acts.

Referring back to FIGS. 2A and 2B, an upper region of each of the pillars 112 may be implanted with a dopant or impurity to form the drain regions 106 of the semiconductor arrays 100 and 101. Exposed portions of the pillars 112 may be doped using conventional methods, such as an ion implantation process, a plasma implantation process or a high temperature diffusion process. For example, the drain regions 106 may be formed by exposing the semiconductor array 150 to an n-type dopant, such as phosphorous or arsenic, such that an n-type material is formed. As another example, a thin film of a highly doped n-type material (not shown) may be deposited over surfaces of the pillars 112 and a thermal anneal may be performed during which dopants migrate from the highly doped n-type material into the pillars 112 to form the drain regions 106.

Figure 10:
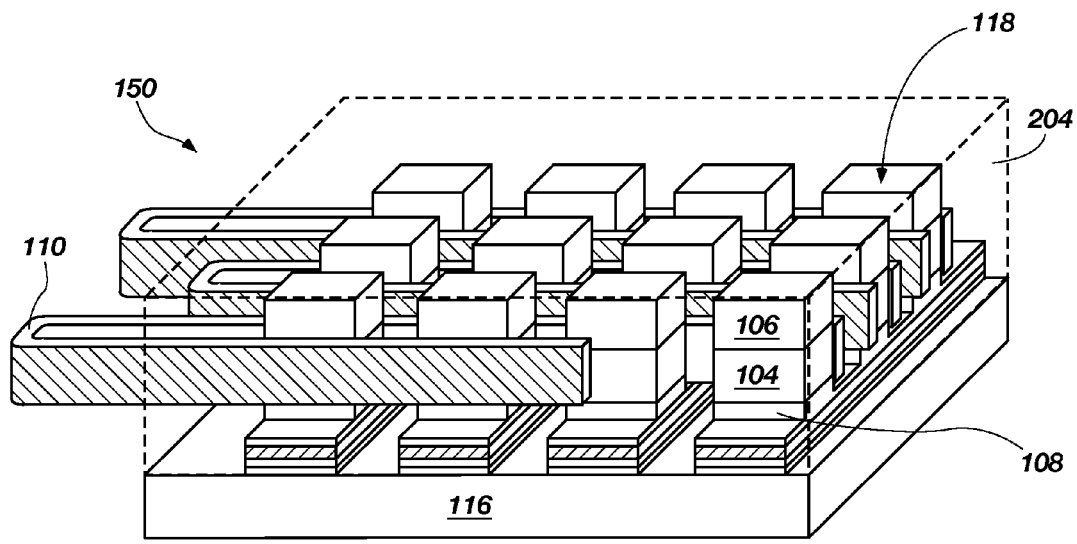

FIGS. 10-13 illustrate a method of forming a DRAM cell 200 (FIG. 13) from the semiconductor array 100 shown in FIG. 2A. The DRAM cell 200 may include conductive caps 202, each of which overlies and contacts one of the drain regions 106 of the semiconductor array 100. As shown in FIG. 10, after forming the gate electrodes 110, a first dielectric material 204, shown in broken lines, may be deposited over the semiconductor array 100 shown in FIG. 2A to fill remaining voids and a chemical-mechanical polishing (CMP) process may be used to remove portions of the first dielectric material 204 such that the upper surfaces 118 of the drain regions 106 are exposed.

Figure 11:
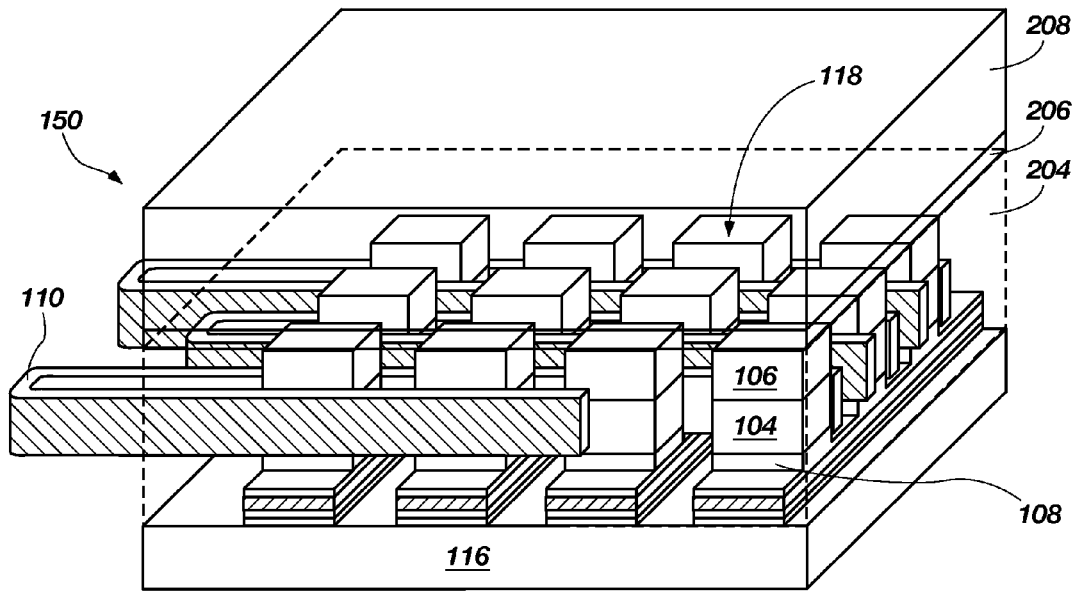

Referring to FIG. 11, a second dielectric material 206 may be deposited over the first dielectric material 204 and exposed surfaces of the drain regions 106. After depositing the second dielectric material 206, a third dielectric material 208 that may be selectively etched with respect to the second dielectric material 206 may be formed over the second dielectric material 206. For example, if the third dielectric material 208 includes an oxide material, the second dielectric material 206 may be formed from a nitride material that may be selectively etched with respect to the oxide material. The second dielectric material 206 and the third dielectric material 208 may each be formed by a deposition technique known in the art, such as, for example, chemical vapor deposition (CVD) or plasma vapor deposition (PVD).

Figure 12:
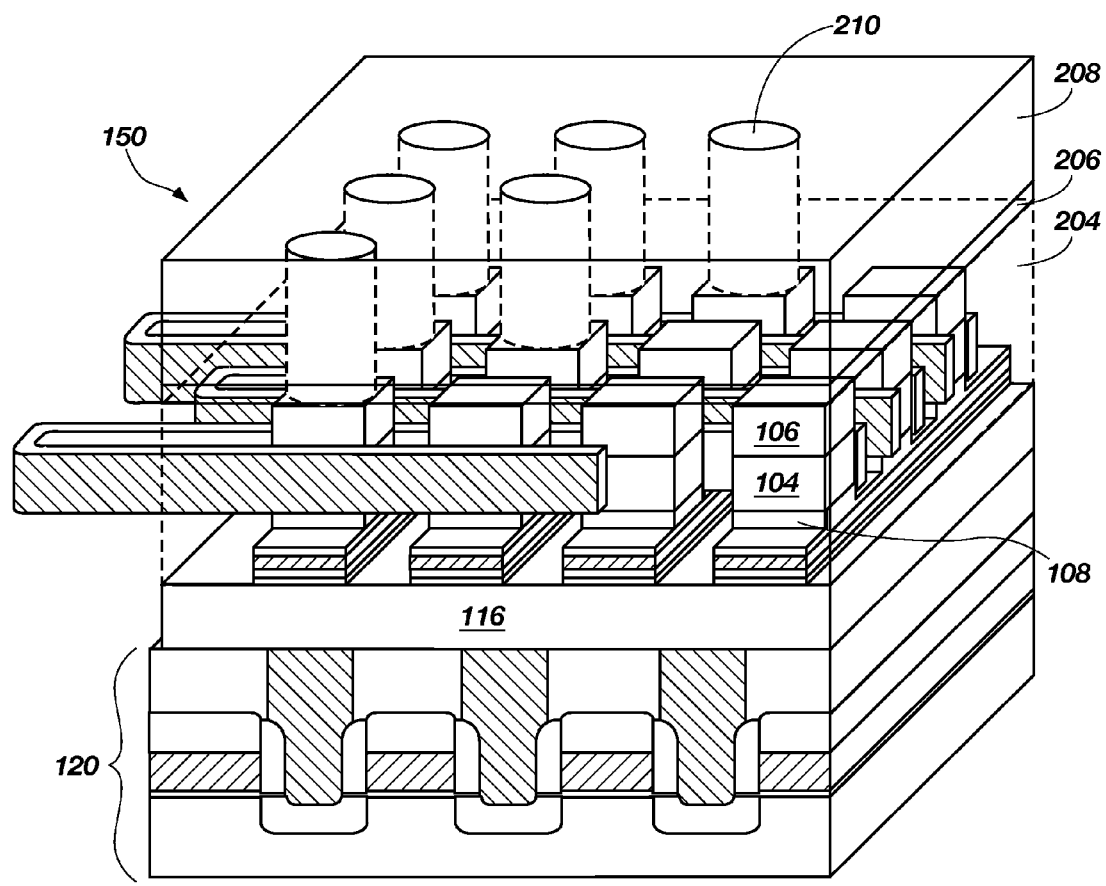

Referring to FIG. 12, holes 210 may be formed by removing a portion of the third dielectric material 208 and the second dielectric material 206 to expose a portion of the drain region 106. The holes 210 may be formed by depositing a mask material (not shown) over the third dielectric material 208 and patterning the mask material to form apertures through which surfaces of the third dielectric material 208 are exposed. The mask material may include, for example, a photoresist material, an oxide material, transparent carbon or amorphous carbon. Methods of forming and patterning the mask material are known in the art and, therefore, are not described in detail herein. A reactive ion etching (RIE) process may be used to remove portions of the third dielectric material 208 exposed through the apertures in the mask material without removing underlying portions of the second dielectric material 206. Another reactive ion etching (RIE) process may be used to remove portions of the second dielectric material 206 to form holes 210. The second dielectric material 206 may be removed with minimal over-etching thereof to prevent future cell conductive material shorting to the underlying gate electrode 110 The remaining portions of the mask material may then be removed.

Figure 13:
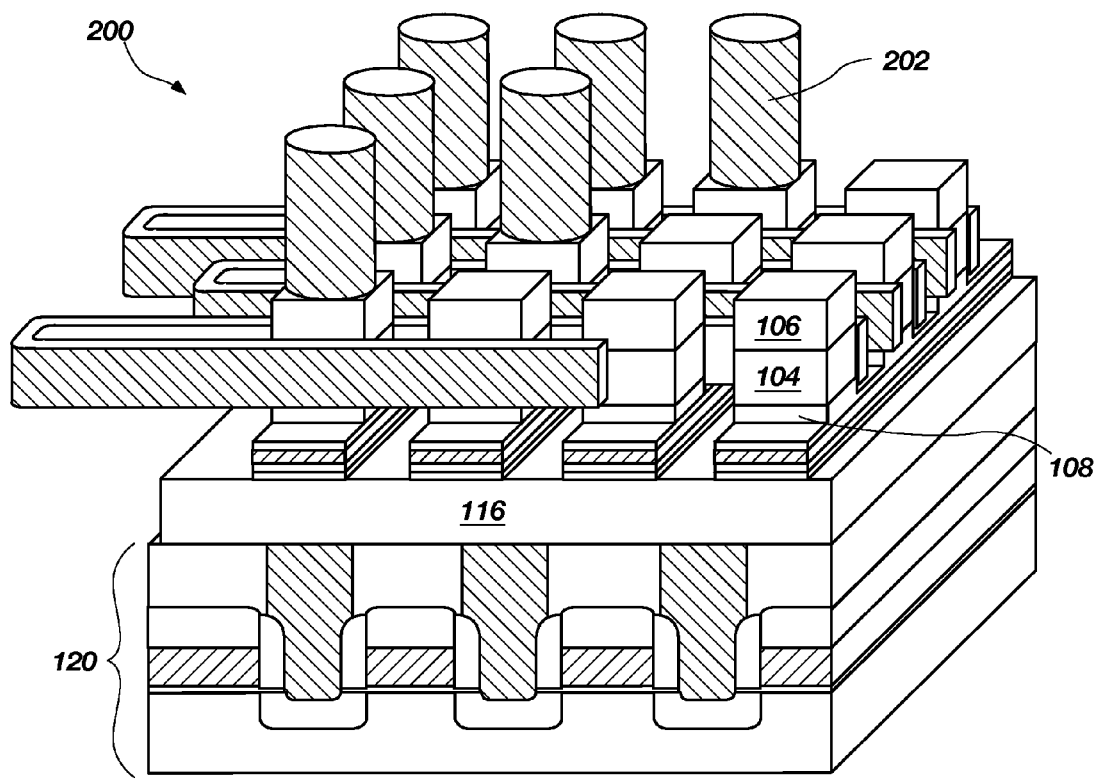
FIG. 13 illustrates a perspective view of a portion of a semiconductor device in accordance with an embodiment of the present disclosure.

Referring to FIG. 13, the DRAM cell 200 may be formed by forming a conductive material on sidewalls of the holes 210 (FIG. 12) to form the conductive caps 202. For simplicity, the conductive caps 202 are shown over a plurality of the drain regions 106. However, the conductive caps 202 may additionally be formed over each of the drain regions 106. As a non-limiting example, the conductive caps 202 may be formed by depositing tantalum, tantalum nitride, titanium nitride, tungsten, ruthenium or ruthenium oxide using an ALD process, a CVD process, or a PECVD process. For clarity, the first dielectric material 204, the second dielectric material 206 and the third dielectric material 208 have been omitted from FIG. 13. Each of the conductive caps 202 may overlie the drain region 106 of one of the access devices 102. Each channel region 104 may be substantially isolated from the underlying conductive line 114 by the source region 108 disposed therebetween and may be substantially isolated from the overlying conductive cap 202 by the drain region 106 disposed therebetween.

Figure 14:
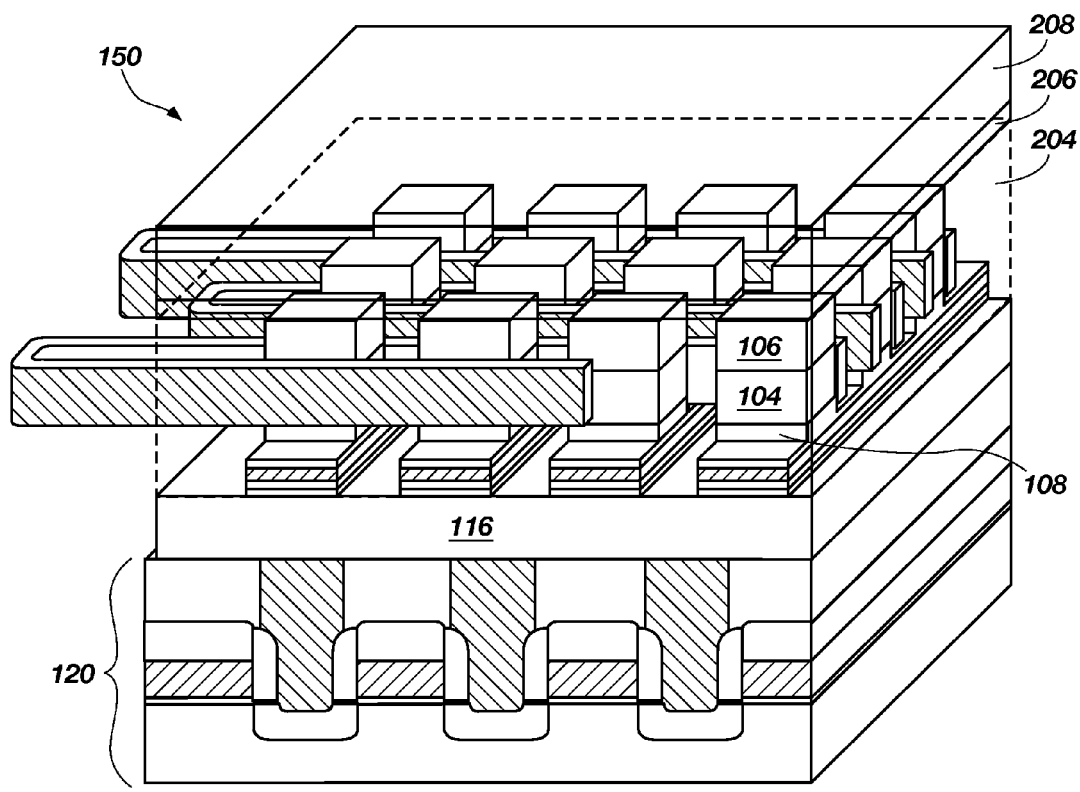
FIGS. 14 and 15 illustrate perspective views of a portion of a semiconductor array during various stages of fabrication in accordance with embodiments of the present disclosure.
Figure 15:
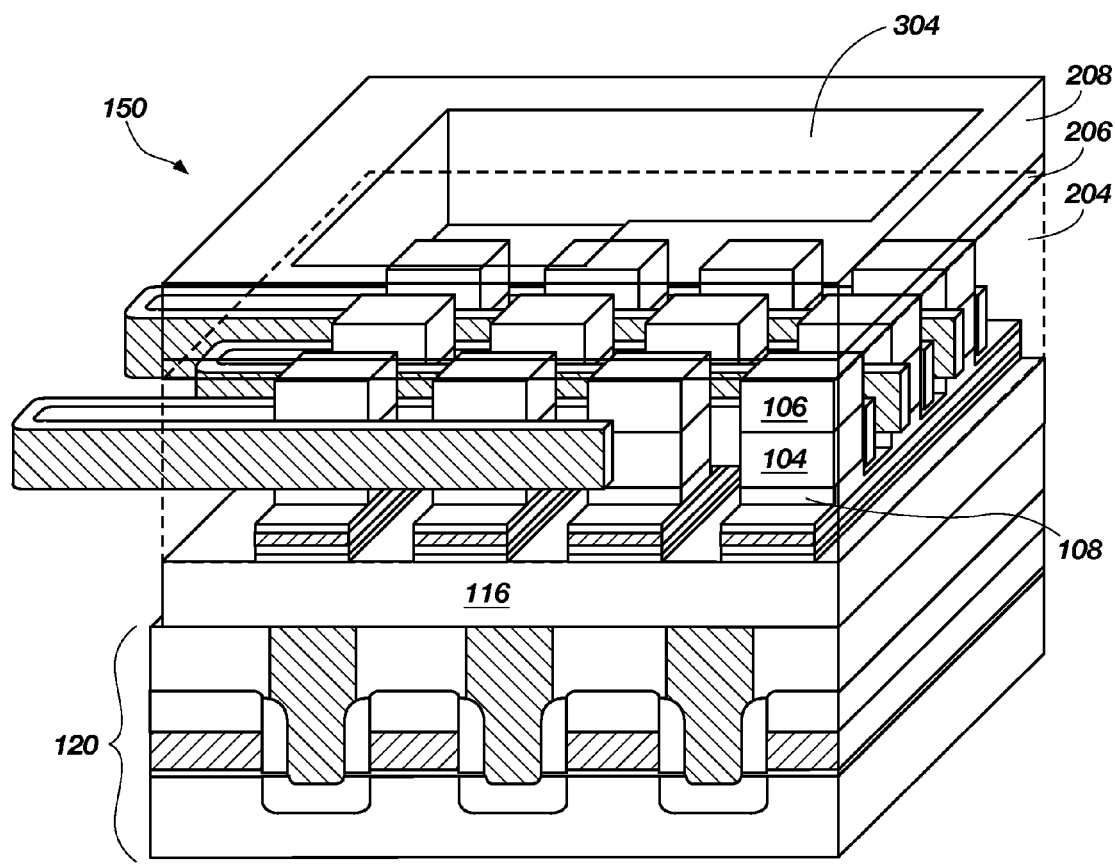
Figure 16:
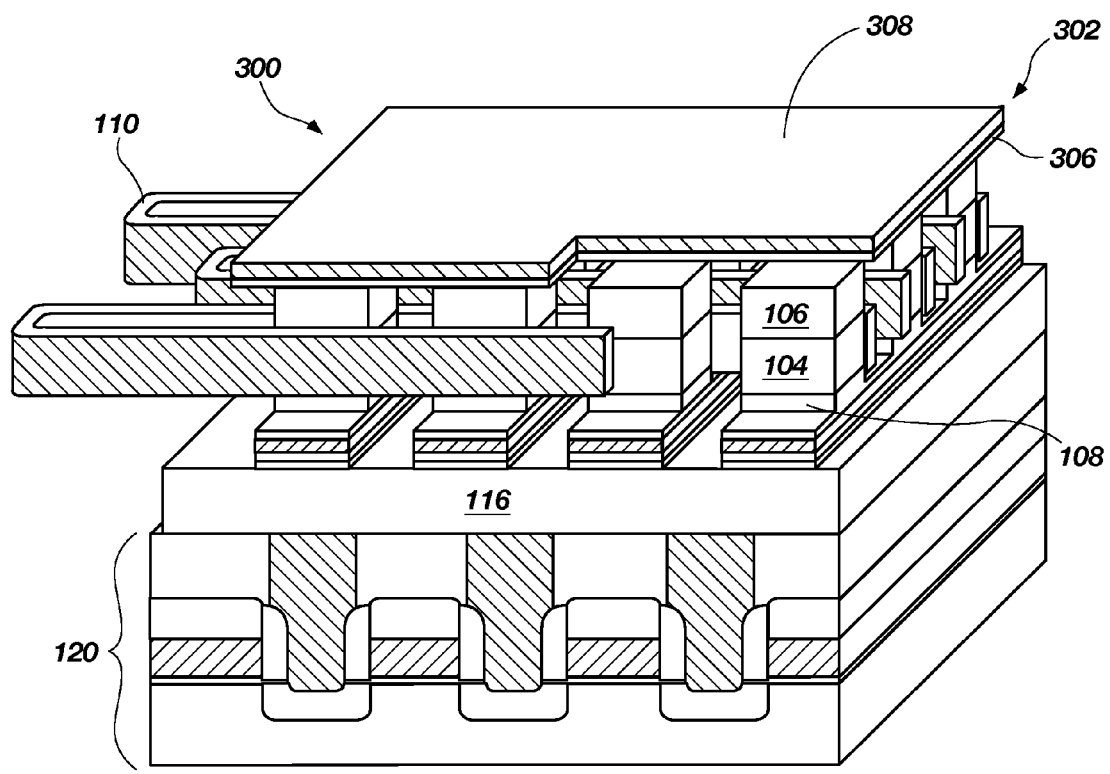
FIG. 16 illustrates a perspective view of a portion of a semiconductor device in accordance with an embodiment of the present disclosure.

FIGS. 14-16 illustrate methods of forming a non-volatile memory (NMV) array 300 (FIG. 16) including a conductive plate 302 overlying and contacting the drain regions 106 of semiconductor array 100 shown in FIG. 2A. The drain regions 106 may function as a bottom electrode. As shown in FIG. 14, after forming the gate electrodes 110, a first dielectric material 204 (shown in broken lines to more clearly illustrate the underlying structure), a second dielectric material 206 and a third dielectric material 208 may be formed over the semiconductor array 100 shown in FIG. 2A using the methods described with respect to FIGS. 10 and 11.

Referring to FIG. 15, a void 304 may be formed by removing a portion of the third dielectric material 208 and the second dielectric material 206 to expose a portion of the drain region 106. For example, the void 304 may be formed by depositing a mask material (not shown) over the third dielectric material 208 and patterning the mask material to form apertures through which surfaces of the third dielectric material 208 is exposed. The mask material may include, for example, a photoresist material, an oxide material, transparent carbon or amorphous carbon. Methods of forming and patterning the mask material are known in the art and, therefore, are not described in detail herein. A reactive ion etching (RIE) process may be used to remove portions of the third dielectric material 208 exposed through the apertures in the mask material without removing underlying portions of the second dielectric material 206. Another reactive ion etching (RIE) process may be used to remove portions of the second dielectric material 206 to extend the void 304 therethrough. The remaining portions of the mask material may then be removed.

Referring to FIG. 16, the NVM array 300 may be formed by partially filling the void 304 (FIG. 15) with a memory material 306 and an electrode material 308 to form the conductive plate 302. The electrode material 308 of the conductive plate 302 may function as a top electrode. For clarity, the first dielectric material 204, the second dielectric material 206 and the third dielectric material 208 have been omitted from FIG. 16. The memory medium 306 may include, for example, an oxide material or phase-change material, such as a germanium-antimony-tellurium (GST) material or another chalcogenide material. The electrode material 308 may include a conductive material, such as, tantalum nitride, titanium nitride, tungsten, tungsten silicide or aluminum. The memory material 306 and the electrode material 308 may be formed in the void 304 using conventional deposition techniques. The memory material 306 of the conductive plate 302 may be sensitive to high temperatures, such as temperatures of greater than about 150° C. The present method of forming the NMV array 300 provides formation and integration of the conductive plate 302 after processing acts that utilize increased temperatures, thus preventing damage to the memory material 306.

Referring to FIG. 16, the NVM array 300 may be formed by partially filling the void 304 (FIG. 15) with a memory material 306 and an electrode material 308 to form the conductive plate 302. The electrode material 308 of the conductive plate 302 may function as a top electrode. For clarity, the first dielectric material 204, the second dielectric material 206 and the third dielectric material 208 have been omitted from FIG. 16. The memory medium 306 may include, for example, an oxide material or phase-change material, such as a germanium-antimony-tellurium (GST) material or another chalcogenide material. The electrode material 308 may include a conductive material, such as, tantalum nitride, titanium nitride, tungsten, tungsten silicide or aluminum. The memory material 306 and the electrode material 308 may be formed in the void 304 using conventional deposition techniques. The memory material 306 of the conductive plate 302 may be sensitive to high temperatures, such as temperatures of greater than about 150° C. The present method of forming the NMV array 300 provides formation and integration of the conductive plate 302 after processing acts that utilize increased temperatures, thus preventing damage to the memory material 306.

Figure 17:
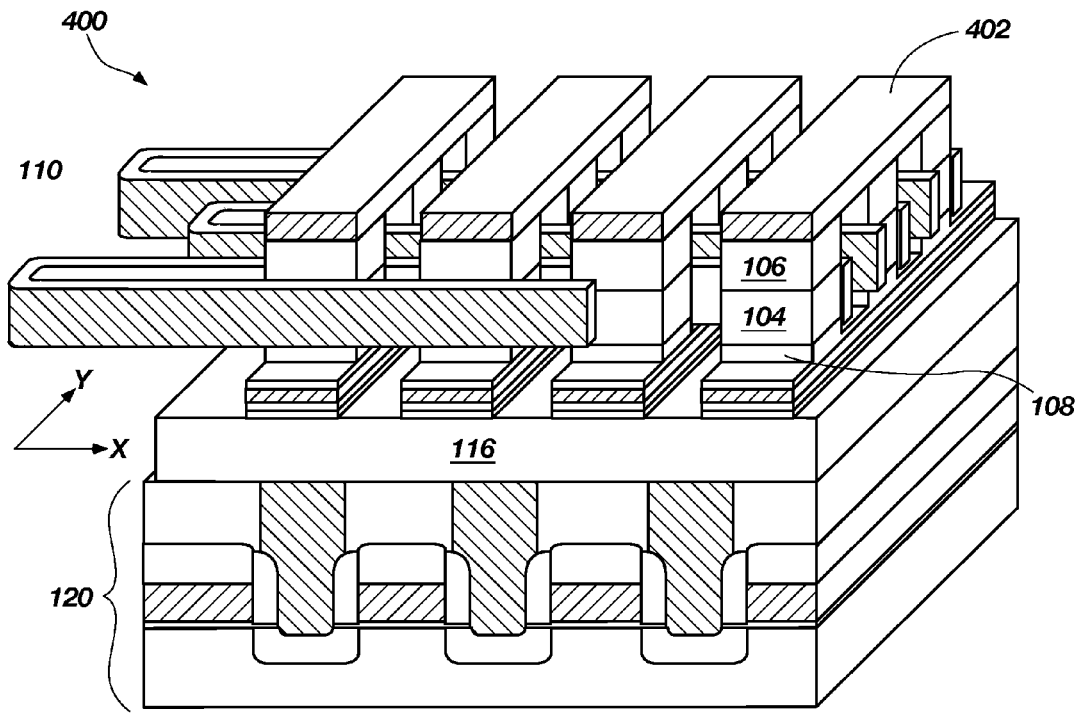
FIG. 17 illustrates a perspective view of a portion of a semiconductor device in accordance with an embodiment of the present disclosure.

FIG. 17 illustrates a vertical field effect transistor (V-FET) device 400 formed by fabricating one or more data/sense lines, such as bit lines 402, over and in contact with the drain regions 106 of the transistors 103 of the semiconductor array 101 shown in FIG. 2B. The bit lines 402 may be formed by depositing and pattering a conductive material to form bit lines 402 extending in the second direction Y, substantially perpendicular to the gate electrodes 110. In one embodiment, the bit lines 402 may be formed using a conventional damascene or subtractive process. For example, a conductive material (not shown) may be formed over the semiconductor array 101 (FIG. 2B) and portions thereof may be removed through apertures in a photoresist material to define the bit lines 402. In another embodiment, the bit lines 402 may be formed using a conventional lithographic process. For example, a sacrificial dielectric material (not shown) may be deposited over the semiconductor array 101 and a pattern of apertures may be formed therein, using a conventional lithographic process, at locations in which the bit lines 402 are to be formed. A conductive material may be deposited to fill the apertures and a chemical mechanical polishing process may be used to remove a portion of the conductive material overlying the sacrificial material to form the bit lines 402.

Figure 18:
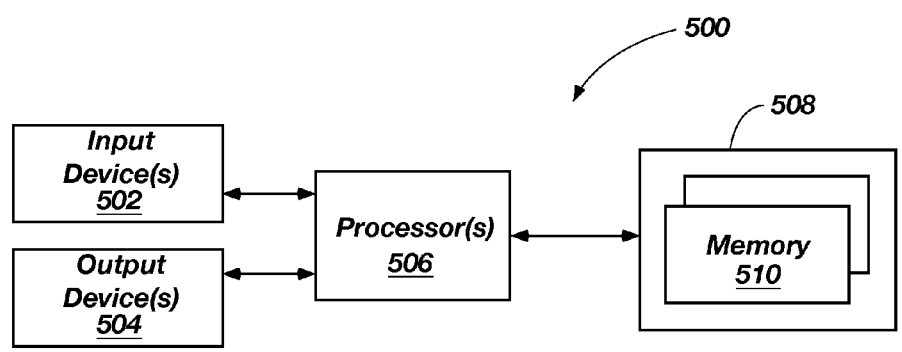
FIG. 18 illustrates a simplified block diagram of a system implemented according to one or more embodiments described herein.

FIG. 18 illustrates a simplified block diagram of an electronic system 500 implemented according to one or more embodiments described herein. The electronic system 500 includes at least one input device 502, at least one output device 504, a memory semiconductor array, such as one or more processors 506 may, and one or more memory devices 508. The memory devices 508 include at least one semiconductor memory 510 incorporating at least one embodiment of the devices or methods described herein. The electronic system 500 may be part of a number of computing, processing, and consumer products. As non-limiting examples, some of these products may include personal computers, handheld devices, cameras, phones, wireless devices, displays, chip sets, set top boxes, games, and vehicles.

The semiconductor devices 200, 300 and 400 respectively shown in FIGS. 13, 16, and 17 may each be disposed over or under logic devices using the bonding and material transfer process described in FIGS. 4 and 5. Accordingly, the methods described herein provide a means of forming multi-level, memory structures. Using the methods described herein, conductive elements of the semiconductor devices 200, 300 and 400 respectively shown in FIGS. 13, 16, and 17, such as conductive lines 108, gate electrodes 110, conductive caps 202, conductive plate 302, or bit lines 402, may be aligned with electrical interconnects of underlying or overlying logic device(s) so that additional area is not consumed by electrical interconnects in peripheral regions. Thus, an increased area of a wafer is available for forming the logic devices. Furthermore, after forming one of the semiconductor devices 200, 300 and 400 respectively shown in FIGS. 13, 16, and 17, the methods shown in FIGS. 3-13 may be repeated to form a multi-level semiconductor device including a plurality of vertically-stacked semiconductor devices, memory or logic and having increased memory density.

CONCLUSION

In some embodiments, the present invention includes an access device including a conductive line disposed over a substrate and a transistor comprising channel region interposed between a source region and a drain region, the source region disposed on the conductive line. The conductive line may include a conductive material overlying a silicon material disposed on an electrically insulative material overlying the substrate. At least two opposite sidewalls of each of the conductive line and the transistors are continuous and aligned. At least a portion of the source region may be vertically superposed and extends continuously over the conductive line. The access devices may further include an access line disposed on sidewalls of the transistor and the access line may be operably coupled to a voltage source. Since the conductive line is positioned on the substrate underlying the transistors, the drain region of the transistor may exposed enabling interconnection. The access device may have a cell size of less than or equal to $4F^2$.

In additional embodiments, the present invention includes a semiconductor device including at least one conductive line, a plurality of transistors disposed on the at least one conductive line and at least one access line disposed on sidewalls of the plurality of transistors. Each of the plurality of transistors comprising a first doped region interposed between second doped regions, the first doped regions and the second doped regions being oppositely doped. Each of the plurality of access devices has a cell size of $4F^2$, wherein F is equal to a feature size of one of the transistors. The at least one conductive line may be disposed on an electrically insulative material overlying a logic device formed on a wafer. The plurality of transistors may be disposed in an array wherein the transistors are aligned in a plurality of rows extending in a first direction and aligned in a plurality of columns extending in a second direction opposite the first direction. The plurality of transistors aligned in each of the plurality of rows may be disposed on a single conductive line. Sidewalls of each of the plurality of transistors may be substantially aligned with sidewalls of the at least one conductive line. The plurality of transistors disposed on the at least one conductive line may include a plurality of transistors formed in a pillar of semiconductive material overlying the at least one conductive line. The semiconductor device may further include at least one logic device disposed thereunder.

In yet further embodiments, the present invention includes a method of forming a semiconductor array. The method may include forming a semiconductor structure comprising a silicon material overlying an electrically insulative material, a conductive material overlying the silicon material, a doped material overlying the conductive material and a semiconductive substrate overlying the doped material, removing portions of each of the semiconductive substrate and the doped material to form a plurality of trenches, removing additional portions of the semiconductive substrate and the doped material to form a plurality of pillars, each including a channel region and a source region oppositely doped with respect to the channel region, forming at least one access line on a surface of each of the plurality of pillars and exposing the plurality of pillars to a dopant to form a drain region in each of the plurality of pillars, the drain region of each of the plurality of pillars spaced apart from the source region by the channel region and oppositely doped with respect to the channel region. The method may further include forming at least one conductive line over and in contact with the fourth doped region of each of the plurality of pillars. Portions of the conductive material and the silicon material may also be removed to define a plurality of conductive lines on the electrically insulative material. The semiconductor structure may be formed by forming a donor wafer comprising the amorphous silicon overlying the conductive material, the conductive material overlying the doped material disposed on a crystalline silicon wafer, implanting ions a predetermined depth into the crystalline silicon wafer, attaching the amorphous silicon of the donor wafer to the electrically insulative material on an acceptor wafer and separating a portion of the donor wafer to leave a portion of the crystalline silicon wafer, the doped material, the conductive material, and the amorphous silicon overlying a surface of the electrically insulative material of the acceptor wafer.

In yet further embodiment, the present invention includes a system comprising at least one memory semiconductor array and at least one semiconductor array operably coupled to the at least one memory semiconductor array at least one conductive line. The at least one semiconductor array includes a plurality of transistors disposed on the at least one conductive line, each of the plurality of transistors comprising a channel region interposed between a source region and a drain region and at least one access line associated with the plurality of transistors. The plurality of transistors may be aligned in a plurality of rows wherein each of the plurality of transistors aligned in one of the plurality of rows is disposed on a single conductive line. The system may further include at least one conductive structure electrically coupled with the drain region of at least one of the plurality of transistors. The at least one conductive structure may include a plurality of conductive caps, each disposed on and in contact with the drain region of one of the plurality of transistors, or a conductive plate disposed on and in contact with the plurality of transistors and comprising at least one phase-change material.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from scope of the invention as defined by the claims that follow, and their legal equivalents.

What is claimed is:

1. A method of forming a semiconductor array, comprising:
    forming a semiconductor structure comprising a silicon material overlying an electrically insulative material, a conductive material overlying the silicon material, a doped material overlying the conductive material and a substrate overlying the doped material;
    removing portions of each of the substrate and the doped material to form a plurality of trenches;
    removing additional portions of the substrate and the doped material to form a plurality of pillars, each pillar of the plurality of pillars including a channel region and a source region oppositely doped with respect to the channel region;
    forming at least one access line on a surface of each of the plurality of pillars; and
    exposing the plurality of pillars to a dopant to form a drain region in each of the plurality of pillars, the drain region of each of the plurality of pillars spaced apart from the source region by the channel region and oppositely doped with respect to the channel region.

2. The method of claim 1, further comprising forming at least one conductive structure over and in contact with the drain region of each of the plurality of pillars.

3. The method of claim 1, wherein removing portions of each of the semiconductive substrate and the doped material to form a plurality of trenches further comprises removing portions of the conductive material and the silicon material to define a plurality of conductive lines on the electrically insulative material.

4. The method of claim 1, wherein forming a semiconductor structure comprising a silicon material overlying an electrically insulative material, a conductive material overlying the silicon material, a doped material overlying the conductive material and a substrate overlying the doped material comprises:
    forming a donor wafer comprising the silicon material overlying the conductive material, the conductive material overlying the doped material disposed on the substrate;
    implanting ions a predetermined depth into the substrate;
    attaching the silicon material of the donor wafer to the electrically insulative material on an acceptor wafer; and
    separating a portion of the donor wafer to leave a portion of the substrate, the doped material, the conductive material, and the silicon material overlying a surface of the electrically insulative material of the acceptor wafer.

5. The method of claim 1, wherein forming a semiconductor structure further comprising forming a semiconductor structure comprising a logic device formed on a wafer underlying the electrically insulative material.

6. The method of claim 1, wherein removing portions of each of the substrate and the doped material to form a plurality of trenches comprises forming the plurality of trenches extending in a first direction.

7. The method of claim 6, wherein removing additional portions of the substrate and the doped material to form a plurality of pillars comprises removing material in a second direction substantially perpendicular to the first direction to form the plurality of pillars.

8. The method of claim 1, further comprising repeating the acts of forming a semiconductor structure, removing portions of each of the substrate and the doped material to form a plurality of trenches, removing additional portions of the substrate and the doped material to form a plurality of pillars, and forming at least one access line on a surface of each of the plurality of pillars to form another semiconductor array overlying the semiconductor array.

9. The method of claim 1 wherein the conductive material comprises at least one of a phase change material, titanium, titanium silicide, titanium oxide, titanium nitride, tantalum, tantalum silicide, tantalum oxide, tantalum nitride, tungsten, tungsten silicide, tungsten oxide, aluminum, and tungsten nitride.

10. The method of claim 1 wherein the silicon is amorphous.

11. The method of claim 10 wherein the silicon is formed by PVD.

12. The method of claim 1 wherein the silicon is polycrystalline.

13. The method of claim 12 wherein the silicon is formed by PVD.

14. The method of claim 1 wherein an outer surface of the amorphous silicon is treated with plasma.

15. The method of claim 1 wherein an outer surface of the amorphous silicon is treated with at least one of ammonium hydroxide or hydrogen fluoride.

* * * * *